(12) United States Patent
Nakabayashi et al.

(10) Patent No.: US 9,748,164 B2
(45) Date of Patent: Aug. 29, 2017

(54) SEMICONDUCTOR DEVICE

(71) Applicant: NICHIA CORPORATION, Anan-shi, Tokushima (JP)

(72) Inventors: Takuya Nakabayashi, Tokushima (JP); Yoshitaka Bando, Anan (JP); Hiroto Tamaki, Anan (JP)

(73) Assignee: Nichia Corporation, Anan-shi (JP)

( * ) Notice: Subject to any disclaimer, the term of this patent is extended or adjusted under 35 U.S.C. 154(b) by 0 days.

(21) Appl. No.: 14/196,778

(22) Filed: Mar. 4, 2014

(65) Prior Publication Data
US 2014/0252574 A1 Sep. 11, 2014

(30) Foreign Application Priority Data

Mar. 5, 2013 (JP) ................................. 2013-043543
Mar. 5, 2013 (JP) ................................. 2013-043551

(51) Int. Cl.
*H01L 23/495* (2006.01)
*H01L 33/62* (2010.01)

(52) U.S. Cl.
CPC .. *H01L 23/49537* (2013.01); *H01L 23/49503* (2013.01); *H01L 23/49562* (2013.01); *H01L 23/49582* (2013.01); *H01L 33/62* (2013.01); *H01L 2924/0002* (2013.01); *H01L 2933/0066* (2013.01)

(58) Field of Classification Search
CPC ............... H01L 23/49537; H01L 33/62; H01L 2924/01082; H01L 23/49541; H01L 2924/0665; H01L 2225/1029; H01L 23/4951; H01L 23/495; H01L 23/49582
See application file for complete search history.

(56) References Cited

U.S. PATENT DOCUMENTS

| | | | | |
|---|---|---|---|---|
| 5,250,840 A | * | 10/1993 | Oh ....................... | H01L 23/4951 257/666 |
| 6,388,311 B1 | * | 5/2002 | Nakashima ....... | H01L 23/49503 257/666 |
| 2013/0049049 A1 | * | 2/2013 | Choi ..................... | H01L 33/486 257/98 |

(Continued)

FOREIGN PATENT DOCUMENTS

| | | |
|---|---|---|
| JP | 60-206053 A | 10/1985 |
| JP | 61-007673 A | 1/1986 |

(Continued)

OTHER PUBLICATIONS

International Search Report of the International Patent Application No. PCT/JP2014/055589, dated Apr. 28, 2014.

*Primary Examiner* — Khiem D Nguyen
(74) *Attorney, Agent, or Firm* — Global IP Counselors, LLP

(57) ABSTRACT

A lead frame of high quality which can endure direct bonding to the electrodes of a semiconductor element and a metal member, and a semiconductor device of high reliability which utilizing the lead frame. The lead frame includes a pair of lead frame portions which are arranged spaced apart from and opposite to each other to be electrically connected to a pair of electrodes of a semiconductor element respectively, and a pair of support bars which are arranged spaced apart from the lead portions and extending from a side of either one of the lead portions to a side of the other lead portion.

13 Claims, 14 Drawing Sheets

(56) References Cited

U.S. PATENT DOCUMENTS

2013/0070452 A1* 3/2013 Urano .................... H05K 1/181
                                                              362/231

FOREIGN PATENT DOCUMENTS

| JP | 03188658 A | * | 8/1991 | ............ | H01L 23/50 |
|---|---|---|---|---|---|
| JP | 05-102386 A | | 4/1993 | | |
| JP | 08-023059 A | | 1/1996 | | |
| JP | 2011-151069 A | | 8/2011 | | |
| JP | 2011-249737 A | | 12/2011 | | |
| JP | 2012-186192 A | | 9/2012 | | |
| JP | 2012-190790 A | | 10/2012 | | |
| JP | 2012-190970 | * | 10/2012 | ............ | H01L 33/62 |
| JP | 2014-116579 A | | 6/2014 | | |

* cited by examiner

SEMICONDUCTOR DEVICE

CROSS-REFERENCE TO RELATED APPLICATION

This application claims priority to Japanese Patent Application No. 2013-043551, filed on Mar. 5, 2013, and No. 2013-043543, filed on Mar. 5, 2013. The entire disclosure of Japanese Patent Application No. 2013-043551 and No. 2013-043543 are hereby incorporated herein by reference.

TECHNICAL FIELD

The present disclosure relates to a semiconductor device applicable to purposes such as an indicator, a lighting apparatus, a display, a backlight light source for liquid crystal display.

BACKGROUND

In recent years, various electronic components have been proposed and are put in practical use, and increasingly high performance has been required on such components. In particular, electric components are required for maintaining performance for a long period of time even under severe environment. The same applies for semiconductor devices such as memory modules and light emitting diodes (LEDs). Requirements for higher performance in the area of general lighting, in-vehicle lighting, and the like, further higher output (higher luminance) and higher reliability are demanded. Accordingly, for example, JP H05-102386A proposes the use of a clad material having a stacked-layer structure formed by pressure bonding, for a lead frame material that has a high degree of hardness and a high electrical conductivity.

Also, depending on the usage of the semiconductor device, further reduction in size of the electric components while retaining the high performance has been demanded. Accordingly, various adjustments have been made in the structure of the package as well as in the structure of the semiconductor element.

For example, in a semiconductor device capable of further reducing the thickness, a provision of irregular shape on the opposing end surfaces of the die pads and the lead portions is proposed to obtain adhesion of the semiconductor element with the sealing resin and the leads (for example, JP2011-151069A etc.).

SUMMARY

The present invention provides a lead frame of high quality which can endure direct bonding to an element, and provides a semiconductor device of high reliability which utilizes the lead frame. The present invention is further able to reduce the size of the electric components, while retaining high performance.

The embodiments include the aspects described below.

(1) A lead frame includes a plurality of units which are connected together, each unit including, a pair of lead portions arranged spaced apart from and opposite to each other to be electrically connected to a pair of electrodes of a semiconductor element respectively, and a pair of support bars arranged spaced apart from the lead portions and extending from a side of one lead portion toward a side of the other lead portion.

(2) A lead frame includes a plurality of units which are connected together, each unit includes a pair of lead portions arranged spaced apart from and opposite to each other to mount a semiconductor element and to be electrically connected to a pair of electrodes of a semiconductor element. The lead portion includes two hook-shaped portions extended from the lead portion. The hook-shaped portion of one lead portion is arranged to surround a tip portion of the hook-shaped portion of the other lead portion at the both sides with respect to a center line of the unit.

(3) A semiconductor device includes a semiconductor element having a pair of electrodes on a same surface side, a lead frame according to one described above, and a resin member disposed at least between the lead portions which are arranged spaced apart and opposite to each other, to fix the lead frame.

(4) A semiconductor device includes a semiconductor element having a pair of electrodes at a same surface side, a lead frame including a pair of lead portions arranged spaced apart and opposite to each other and facing a pair of electrodes of the semiconductor element respectively, and electrically connected to the pair of electrodes via a bonding member; and a resin member at least arranged between the lead frames which are arranged spaced apart from and opposite to each other. The lead frame further includes a pair of support member which are spaced apart from the lead portions and extending from a side of one lead portion toward a side of the other lead portion.

According to the disclosure, a lead frame of high quality which can endure direct bonding to a semiconductor element can be provided. Also, with the use of the lead frame, a semiconductor device which enables further reduction in size and in thickness can be provided.

DETAILED DESCRIPTION

Figure 1A:
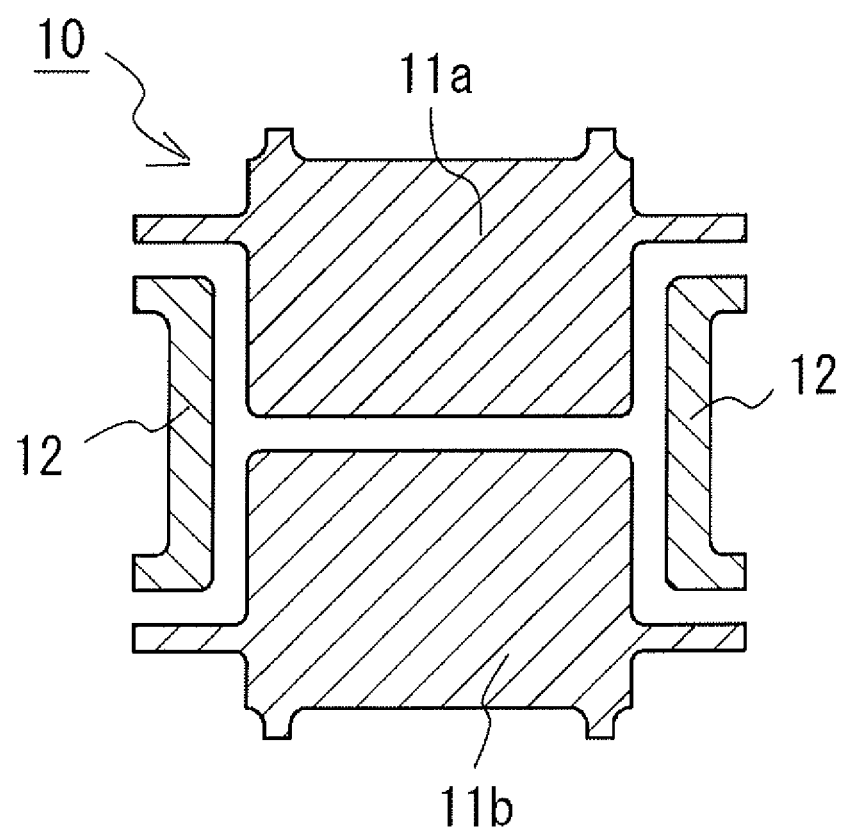
FIG. 1A is a plan view showing an outline of one unit of a lead frame according to Embodiment 1 of the present invention.

Embodiments of the lead frame and the semiconductor device according to the present invention will be described below with reference to the drawings. The sizes and the positional relationships of the members in each of drawings are occasionally shown exaggerated for ease of explanation. Further, in the description below, the same designations or the same reference numerals may, in principle, denote the same or like members and duplicative descriptions will be appropriately omitted.

Lead Frame

The lead frame according to the present embodiment is a metal member and constituted with a plurality of units connected together, each of which includes at least a pair of lead portions to serve as electrodes. In one embodiment, the lead frame can be constituted with a plurality of units connected together, each of which includes a pair of lead portions to serve as electrode, and a pair of support bars corresponding to the pair of lead frame portions. The support bar preferably includes a hook-shaped portion as described below. In another embodiment, the lead frame may be constituted with a plurality of units which includes a pair of lead portions connected together, one lead portion includes two hook-shaped portions respectively extending from the lead portion. Each unit generally has a frame at its outer periphery which is at a border of a unit in the pattern of units. At the time of singulating into the individual semiconductor devices, the lead frame is cut into the individual units. Now, one unit in the lead frame will be described below.

(Lead Portion)

A pair of lead portions are placed spaced apart from and opposite to each other. That is, of the pair of lead portions, one lead portion is arranged to electrically bonded to one electrode of a pair of electrodes, to be described below, in the semiconductor element, and the other lead portion is electrically bonded to the other electrode of the semiconductor element, Thus, the pair of lead portions serve as at least a positive or a negative electrode terminal, respectively.

The lead portion includes a groove for demarcating a region where a semiconductor element to be mounted in a bridge manner on the pair of lead portions. Such a region preferably has a planar dimension and a shape approximate to the semiconductor element or has a slightly larger planar dimension and similar shape. With this arrangement, alignment of the semiconductor element to appropriate locations of the lead portions can be efficiently performed, in order to bond the semiconductor element to the demarcated semiconductor element mounting regions with the bounding member respectively (hereinafter may be referred to as "element mounting region").

The planar dimensions of the lead portions and the element mounting region can be appropriately designed according to the planar dimensions, number, arrangement, or the like, of the semiconductor elements to be disposed thereon. The shape or location of the gap between the pair of element mounting regions can be appropriately designed according to the positive and negative electrodes for the element disposed on the semiconductor element. The surfaces of the lead portions are preferably flat, but a lead frame material having a slight irregular or rough surface can be used. Also, the irregularity or roughness of the surface of the lead frame material which forms a pattern which allows alternate arrangement of the lead frame material and the resin may be employed.

The planar shape of the lead portion is not specifically limited, and in a plan view, a polygonal shape such as a quadrangular shape, a circular shape, an elliptical shape, a shapes similar to those, an irregular shape such as a comblike shape or a saw blade-like shape may be employed. Further, the shape may be in conformity to the shape of the tip of the support bar to be described below. Such shape will be described below. The back-surface of each lead portion may have a shape, such as an irregular shape, which is different from the surface of the lead portion. As shown in FIG. 1B, each of the element mounting regions 11C has a region of a smaller thickness (the portion shaded with cross-hatching) in a part of the lead portion. The region with a smaller thickness is a region processed by etching or pressing from the back-surface side of the lead portion so that the end portion on the back-surface side locates inner side than the end portion of the surface, which can be formed to occupy an area of about 1/5 to 1 time with respect to the element mounting region.

Parts of the groove are respectively started at the end surfaces of the pair of lead portions and extended in a direction away from the end surfaces in conformity with the outer circumferential shape of the semiconductor element. The groove is thus started at the end surfaces, so that at the time of forming the resin member of the semiconductor device, the resin can be injected from the end surface side of the lead portions to apply the coating in the groove. With this, alignment effect of the semiconductor elements described above can be more efficiently exerted. In the specification, the term "extending in a direction away from" preferably refers, for example, extending in a direction perpendicular or approximately perpendicular (±10°) to the edges of the lead portions determined by the end surfaces respectively. Also, the extending portions are preferably formed in a straight line shape.

(Support Bar)

The support bars are arranged spaced apart from the pair of lead portions and extending from a side of one lead portion toward a side of the other lead portion. A pair of such support bars is preferably arranged at the both sides of the lead portion respectively.

The planar shape of the support bars is not specifically limited, as long as it is a narrow elongated shape along the entire length of a side of the semiconductor element to be mounted. For example, a linear shape may be employed, or may include a hook-shaped shape (that is, an L-shape portion) extending from a top of a planar shape along a side of a semiconductor element toward the lead portion. Such a hook-shaped portion may be arranged at one end of one support bar, but preferably arranged at the both ends of one support bar. Such a hook-shaped portion is not necessarily arranged at an end but may be arranged at a middle portion. Such a hook-shaped portion may be arranged at only one of the pair of support bars but preferably arranged at the both. Such a hook-shaped portion may be arranged at different ends or at near the ends of the pair of support bars respectively. Among those, such a hook-shaped portion is preferably arranged at both ends of the pair of support bars. The hook-shaped portion may be, in a plan view, bending toward the lead portion or bending away from the lead portion. The support bars have a uniform width throughout its length, or have uneven width such as a width which is gradually increased or decreased.

In the case where a hook-shaped portion is arranged at a tip of the support bar, the lead portion opposite to the hook-shaped portion is preferably formed with a shape having a portion extending from the lead portion sideway. In other words, the planar shape of the hook-shaped portion preferably has a recessed portion (anchor-shaped portion) in a U-shape or an L-shape in a plan view. The recessed portion is preferably arranged to surround the hook-shaped portion in a U-shape or an L-shape along the shape of the hook-shaped portion of the tip of the support bar. Accordingly, the lead frame can include each one or two to four hook-shaped shapes at the tip of the support bar or recessed portions in the lead portion respectively.

The support bars having such a shape are arranged at the both sides of the lead portions respectively. Thus, in the semiconductor device, even in the case where the electrodes of the semiconductor element and the lead frame are directly bonded, difference in the linear expansion coefficients and/or thermal expansion coefficients between the semiconductor element and the metal member, and/or between the semiconductor element and the bonding member for bonding the semiconductor element to the lead frame, the difference in the linear expansion coefficients between the electrodes connected to the semiconductor layers which constitute the semiconductor element, and the bonding member, can be effectively canceled out. Accordingly, destruction in the bonding can be effectively prevented.

The surface of the support bar may be on a same plane with the surface of the lead portion or the back-surface of the support bar may be on a same plane with the back-surface of the lead portion. That is, the support bar may have a thickness the same as that of the lead portion, but preferably has a smaller thickness. In this case, the surface or the back-surface of the support bar is preferably recessed (locates inner side in the thickness direction) than the surface or the back-surface of the lead portion. Particularly, the back-surface of the support bar (the opposite surface to the surface on which the semiconductor element to be mounted at the time of assembling into a semiconductor device. With this arrangement, occurrence of short circuit etc., associated with the support bar can be prevented. The depth of the recessed portion on the surface or the back-surface of the support bar may be about 5% to about 60% of the total thickness of the lead frame. In order to reduce a thickness of the support bar than the thickness of the lead portion, a known technique in the art, so-called half-etching technique may be employed. More specifically, a technique may be employed in which a mask pattern defining an opening is formed on the surface and/or the back-surface of the support bar, and etching is carried out. Etching conditions can be appropriately adjusted so that only a part in the thickness direction in the opening of the lead frame is etched.

Hook-Like Portion

The lead portion may have two hook-shaped portions extending from the lead portion in one lead portion as described above. In the specification, examples of the portion referred to as "hook-shaped portion" include a portion, in a plan view, having a bending at its end portion, for example, a portion having a bending in an L-shape, a T-shape, a U-shape, a V-shape, a W-shape, etc. Among those, a portion with an L-shape, a U-shape, or a T-shape is preferable. From a different point of view, in other words, the hook-shaped portion may be referred to as, in a plan view, a recessed portion, or a cut-out recess portion. Further, from another point of view, the lead portion has two protrusions and recessed corresponding to the protruded portions and recessed portion as in a male and female snap. Refers to FIG. 1B which is an exploded view of a pair of lead portions, the lead portion 11a has two hook-shaped portions extended from the lead portion 11a at its both sides. The lead portion 11b has two anchor-shaped portions C extending from the lead portion 11ba on its both sides. The term "both sides" in the specification refers to both left and right sides with respect to the arrangement direction of the pair of leads 11a, 11b (X direction in FIG. 1A). In other words, refers to the both sides with respect to the center line of the unit. In the specification, the term "center line" refers to a line through the center or the center of gravity of the unit, and about a ±10% shift in the distance of the centerline with respect to a side of the unit to be allowed. The hook-shaped portions A (recess A) of one lead portion 11a is arranged to surround the tip portion of the hook-shaped portion D (protrusion D) of the other lead portion 11b. Vice versa, the hook-shaped portion D (recess D) of the other lead portion 11b is arranged to surround the tip portion of the hook-shaped portion A (protrusion A) of the one lead portion 11a. This relationship is present at left and right both sides in the arrangement direction of a pair of the lead portions 11a, 11b. From another viewpoint, the lead portion is, in a plan view, in the arrangement direction (X direction in FIG. 1A) of a pair of lead portions, a part of the portion 11b (that is, D1) and a part of the lead portion 11a (that is, A1) are arranged spaced apart from each other and overlap each other, and interlock each other along the recesses and protrusions respectively. Such portions are arranged at left and right both sides in the X direction.

Arranging such a hook-shaped portion at the left and right both sides in the arrangement direction of the pair of lead portions allows, even in the case where the electrodes of the semiconductor element and the lead frame are directly bonded, difference in the linear expansion coefficients between the semiconductor element and the metal member, particularly, the difference in the linear expansion coefficients between the semiconductor layers which constitute the semiconductor element, and the lead frame, can be canceled out effectively. Accordingly, destruction in the bonding can be effectively prevented.

The surface of the hook-shaped portion may be on a same plane with the surface of the lead portion (particularly, semiconductor element mounting surface), or the back-surface of the hook-shaped portion may be on a same plane with the surface of the lead portion (particularly, semiconductor element mounting surface. That is, the hook-shaped portion may have a thickness the same as that of the lead portion, but preferably has a smaller thickness. In this case, the surface or the back-surface of the hook-shaped portion is preferably recessed (located at an inner side in the thickness direction) with respect to the surface of the back-surface of the lead portion. Particularly, the back-surface of the hook-shaped portion (the opposite surface to the surface on which the semiconductor element to be mounted at the time of assembling into a semiconductor device. With this arrangement, occurrence of short circuit etc., associated with the hook-shaped portion can be prevented. The depth of the recessed portion on the surface or the back-surface of the hook-shaped portion may be about 5% to about 60% of the total thickness of the lead frame. In order to reduce a thickness of the hook-shaped portion than the thickness of the lead portion, a known technique in the art, so-called half-etching technique may be employed. More specifically, a technique may be employed in which a mask pattern defining an opening is formed on the surface and/or the back-surface of the hook-shaped portion, and etching is carried out. Etching conditions can be appropriately adjusted so that only a part in the thickness direction in the opening of the lead frame is etched.

Particularly, the hook-shaped portion is formed by using a half-etching technique, the mechanical strength of the package can be improved, and at the time of mounting the semiconductor element in bridging manner over the pair of the lead portions, the bonding strength can be improved and reliability can be secured. Not only applying half etching on one surface, but also applying etching on the surface and the back-surface allows which facilitates control of the anchor effect. Also, an irregular shape such as a corrugated shape may be formed on the surface or the surface or a non-plated surface is provided, with which, adhesion with a resin member can be improved.

The lead portion includes a hook-shaped portion which may increase the planar dimension of the lead portion. Such an increase in the planar dimension may increase the difference in the stress with the semiconductor element. In such a case, providing a through-hole or the like in the lead portion at a portion which is not the hook-shaped portion can reduce the difference in the stress with the semiconductor element.

(Other Portions)

In the lead frame, in an embodiment, a pair of lead portions and the support bars arranged spaced apart from the lead portions respectively as described above are referred to a single unit, and a plurality of the single units are arranged in a matrix, that is, in the longitudinal direction and the lateral direction which is perpendicular to the longitudinal direction. In some other embodiments a pair of lead portions and hook-shaped portions as described above is as a single unit, and a plurality of units are arranged in a matrix.

In the specification, the term "lead frame" includes not only a lead frame that includes only a single unit such as a pair of lead portions, but also includes a lead frame that includes a plurality of units. That is, the lead frame may include a connection portion which allows connection of the lead frames with each other. Although arranged spaced apart from the lead portions in the lead frame corresponding to a single unit of the semiconductor device, the support, a connection portion may be included to connect the support bars and the lead portions. At the time of completion of a semiconductor device to be described below, each portion of the lead frame as described above may be, for example, embedded in a resin member, exposed from the resin member, or separated by cutting. Particularly, the hook-shaped portion is preferably embedded in the resin member. Also, a resin member is preferably filled in the groove in the lead portion as described above.

The shape of the lead frame is not specifically limited as long as arranged spaced apart from and opposite to each other. For example, the lead frame may be formed in a tabular shape or a corrugated shape, or partially thick or thin, or a bending tabular or corrugated shape.

(Material)

The lead frame is generally made of an electrically conductive material which serves as a terminal. Examples such material include metals such as Fe, Ni, Cu, Co, Ti, Sc, Nb, Zn, Zr, W, Mo, Ta, Al, Au, Pt, Ag, Rh, Ru, Pd, Os, Ir, Hf, V, Mn, Cr, La, Y, Sn, and alloys of those. Those may have a single-layer structure or a stacked layer structure (for example a clad material). Fe, Ni, and/or Cu is preferably used as its major component. Also, an inclusion of a minute amount of non-metallic elements such as Si, P may be allowed. The thickness of the lead frame may be, for example, about 100 µm to about 1000 µm.

(Clad Material)

The lead frame of the embodiments preferably includes a clad material. The clad material preferably includes a stacked-layer structure of at least a first metal layer and a second metal layer which is different from the first metal layer. The first metal layer and the second metal layer are needed to have different compositions, and materials which contain the same metal element as their partial component can also be employed. Examples of different metals include metal materials whose linear expansion coefficient, solubility to a specific etching solution, electrical conductivity, thermal conductivity, reflectance and/or hardness, is different with each other. Among those, metals having different linear expansion coefficient and/or thermal expansion coefficient and solubility to a specific etching solution to each other are preferably employed.

The first metal layer and the second metal layer can be selected from the metals or alloys described above. More specifically, the first metal layer preferably has a property that the first metal layer has a linear expansion coefficient or a solubility to a specific etching solution than the second metal layer, copper or copper alloy is more preferable and copper that has an excellent heat dissipating property is further preferable. Particularly, oxygen-free copper that has little impurity and a high thermal conductivity is further preferable. For example, the use of Cu for the portions which serve as the electrode terminals allows for obtaining of a semiconductor device having good heat dissipation. Also, the use of oxygen-free copper at bonding portions with the resin member to be described below allows an improvement in the adhesion of the resin member and the lead frame, and detachment of those can be prevented. Also the use of a copper alloy such as a 194 alloy a EFTEC alloy, or a KFC alloy can facilitates the productivity of the clad material, and can reduce occurrence of warpage, deformation, or the like during processing. The second metal layer is preferably made of iron or an iron alloy, more preferably made of an Inver, a SPCC, a Kovar, or a SUS etc., and further preferably made of a Fe—Ni alloy which has good versatility and workability, or has a low linear expansion coefficient at room temperature.

As described above, adopting a clad material with a stacked-layer structure of the first metal layer and the second metal layer which are made of different metals, properties of the metals can be used in various appropriate combinations, so that while further securing the reliability of the lead frame and of the semiconductor device which uses the lead frame, higher quality can also be achieved. Particularly, in the case where the first metal layer has a linear expansion coefficient larger than that of the second metal layer, the difference in the linear expansion coefficient with respect to the semiconductor element or the like can be reduced to minimum, or the linear expansion coefficient of the bonding member used for bonding the semiconductor element can be approximated with that of the semiconductor element. As a result, destruction in the bonding between the semiconductor element and the lead frame becomes possible to be efficiently prevented. This effect is remarkable in a face-down type semiconductor device in which, the lead portions are electrically connected to a pair of electrodes of a semiconductor element via a bonding member. In the case where the first metal layer has a solubility to the etching solution greater than that of the second metal layer, a shape in which the end surface of one of the first metal layer and the second metal layer further protruding than the end surface of the other metal layer can be easily processed. With this, an increase in the contact area between the lead frames and the resin member can be obtained. Also, anchor effect exerted by the lead frame to the resin member can be achieved.

Typical examples of a specific etching solution include a solution of ferric chloride or copper chloride. The concentration of the solution is not specifically limited, and in consideration of the type of the first metal layer and the second metal layer, the thickness, the mask pattern used in the etching, etc., a concentration generally used in etching can be applied.

The clad material is sufficient to contain a stacked-layer structure of a first metal and a second metal, and preferably has a so-called full surface overlay structure, but may have a structure which includes a part with an overlay structure, an inlay structure, or an edgeless structure. Also, a three layer structure, a four or more layer structure may be included. In this case, a plurality of one of or both the first metal layer and the second metal layer may be included. The third, the fourth, the n-th metal layer etc., which are different from those metal layers may be stacked between the first metal layer and the second metal layer, or stacked on one or both surfaces of the stacked layer of the first metal layer and the second metal layer. The third metal layer etc., of different layers in this case can be made of the materials selected from the materials exemplified for the first metal layer and the second metal layer.

Among those, the lead frame preferably made of a clad material which includes a two layer structure made of the first metal layer and the second metal layer, or which includes a three layer structure or a five layer structure which is made of the first metal layer and the second metal layer alternately bonded in this order. In the case where a clad material of two-layer structure is included, either the first metal layer or the second metal layer can be arranged at the semiconductor element side, but the first metal layer is preferably arranged. With this structure, an irregular or rough texture on the end surface can be easily adjusted. Also, appropriately selecting the materials of the first metal layer and the second metal layer allows adjusting of the linear expansion coefficient which allows reliable prevention of destruction in the bonding and reliable heat dissipation.

Particularly, for the lead frame, a three layer structure of the first metal layer/the second metal layer/the first metal layer. With this arrangement, the support bar (the hook-shaped portion or the anchor-shaped portion), described above preferably formed with a two-layer structure, in which one of the first metal layers is removed by etching to form a two layer structure of the first metal layer and the second metal layer. With such a structure, the setting of the processing conditions can be simplified and the thickness of the support bar (the hook-shaped portion or the anchor-shaped portion) can be reduced easily.

The thickness of the first metal layer and the second metal layer is not specifically limited and for example the first metal layer and the second metal layer can be formed with a thickness of about several tens of µm to about several hundreds of µm. Particularly, in a two-layer structure made of the first metal layer and the second metal layer, the first metal layer of about 10 to about 300 µm and the second metal layer of about 10 to about 300 µm may be employed. In a three-layer structure made of the first metal layer, the second metal layer, and the first metal layer bonded in this order, the first metal layers may respectively have a thickness of about 50 to about 200 µm and the second metal layer may have a thickness of about 50 to about 200 µm. In this case, the first metal layers may have the same thickness or may have different thicknesses. Particularly, in the case to be used in a semiconductor device, the first metal layer which has a greater thickness is preferably arranged at a side farther from the semiconductor element.

In the case where a shape includes the end surface of either of the first metal layer or the second metal layer protruded more than the end surface of the other, a shape which can exert maximum anchor effect is preferably designed. Examples of such a shape include: (1) a shape in which the end surface of the second metal layer is protruded more than the end surface of the first metal layer, (2) a shape in which all the end surfaces of the first metal layer and the second metal layer in one side in the thickness direction are protruded more than the corresponding end surfaces of the other side respectively, (3) in a clad material of three-layer structure in which the first metal layer, the second metal layer, and the first metal layer are bonded in this order, the end surface of the second metal layer is more protruded than the end surfaces of the first metal layers, (4) the end surface of the second metal layer is slanted so that one end of the end surface of the second metal layer meets the adjacent end of one of the first metal layer and the other end of the end surface of the second metal layer meets the adjacent end of the other first metal layer, (5) the end surfaces of the first metal layers are at inner side than any portions of the end surface of the second metal layer, and (6) The end of the end surface of each of the first metal layers adjacent to the corresponding ends of the end surface of the second metal layer are at outer locations than the other end, which is distal to the corresponding end of the end surface of the second metal layer, of the end surface of each of the first metal layers respectively.

(Plated Layer)

The lead frame may have a plated layer applied on the surface or the back-surface or on both the surface and back-surface, or on the surface or the back-surface or on both the surface and the back-surface and the end surface. In the case where the clad material includes the first metal layer, the second metal layer, and the third metal layer described above, a plated layer is not needed between the layers, but is applied on the portions exposed on the surfaces (front surface, back-surface, end surface). For example, a plated layer may be applied on the surface or the back-surface or on both the surface and back-surface, or on the surface or the back-surface or on both the surface and the back-surface and the end surface of the clad material. Examples of the material of the plated layer include Ag, Al, Au or an alloy of those. Among those, a plated layer of Ag is preferable. With this arrangement, in the case where the semiconductor element is a light emitting element, particularly, efficient extraction of light from the light emitting element can be realized. In the case where the first metal layer and/or the second metal layer is not present at the outermost surface of the clad material, the plated layer is not applied in contact with the first metal layer and/or the second metal layer, but is applied in contact with the layer which presents at the outermost surface of the clad material. Also, on the surfaces of the lead frame (end surface, upper surface, lower surface), a plated under layer is preferably formed. For example, in the case where the outermost surface to be a Ag plated layer, a plated layer of Cu, Ni, or the like is preferably formed as the plated. The plated layer may be formed before processing the lead frame but is preferably formed after processing the lead frame (pattering) to be described below. With this, the plated layer can be applied even further on the end surface of the clad material. The thickness of the plated layer is not specifically limited, and for example, about 1 μm to 10 μm may be employed.

The lead frame can be produced by using a known method or according to a known method. Particularly, examples of the methods of producing a clad material described above include, a hot-rolling method in which a core material and a surface material in solid state are welded under high temperature and pressure in pressure welding, a fusion welding method such as overlay welding, casting, or tinkering, a non-fusion welding method such as rolling welding, explosive welding, or diffusion welding, or a semi-fusion welding method such as sintering or thermal spraying. More specific examples include a method described in JP H05-102386A. A clad material in which copper or a copper alloy is joined on a core material made of an iron-based alloy such as a ferric stainless steel which is a ferromagnetic substance is preferable.

There are no particular limitations on the method of processing the lead frame, and patterning to obtain a predetermined shape for the lead portions, the support bars or the like can be performed with the use of a method commonly used to process a lead frame such as pressing, punching, blasting, etching, or the like. The end surfaces of the lead frame, particularly end surfaces of portions to be embedded in a resin member as described below are preferably slanted or have an irregular shape on the surfaces. With this arrangement, anchor effect exerted by the lead frame to the resin member can be achieved.

For example, in the case where a clad material is used, a processing is preferably performed so that an end surface of the first metal layer or the second metal layer is more protruded than the end surface of the other metal layer. Examples of such a method include wet etching which uses an etching solution having different etching rates with respect to the first metal layer and the second metal layer. In this case, etching is suitably performed on one surface of the lead frame with the use of a mask-pattern which provides masking or opening of a desired shape. The etching is preferably performed on both surfaces of the lead frame with the use of a mask-pattern which provides masking or opening of a desired shape. With this, the processing time and the processing cost can be reduced. The mask patterns formed on the both surfaces may have the same shape or different shapes.

Also, it may be such that with the use of a technique such as pressing, punching, blasting, or the like, which is generally used in processing a lead frame, a desired pattern is formed in the lead frame. Then, a mask pattern which has an opening which is only for the outermost metal layers of the first metal layer and the second metal layer is formed, and performing blasting, etching, etc., a shape in which the end surface of the first metal layer or the second metal layer is protruded more than the end surface of the other end surface.

With the use of the technique as described above, a shape which corresponds to the one unit described above may only be processed, but preferably a shape in which a plurality of the shapes which are arranged in an array is processed. The use of such a processing technique can facilitate processing of the units for a plurality of light emitting device at a single time. The processing shape, that is, the end surface of either the first metal layer or the second metal layer can be formed more protruded than the end surface of the other metal layer and the degree of protrusion can be easily adjusted. With this arrangement, in the case where the lead frame is used in a semiconductor device, anchor effect to the resin member which will be described below, can be more efficiently exerted. Particularly effective in the application to the semiconductor element (chip size) of extremely small size and the semiconductor device of extremely low height.

As described above, in the case where the lead frame to have a plated layer disposed on the surface and/or the back surface and/or the end surface of the lead frame, the plating is preferably disposed after processing the clad layer. In this case, the first metal layer and the second metal layer may not be exposed at the end surface of the lead frame after processing. The lead frame is molded with a resin member, then, singulated (cut) into individual semiconductor devices. Accordingly, the end surfaces of the cut portion of the lead frame may have a part where the first metal layer and the second metal layer are exposed, also, the end surfaces may not include a protruded portion and align in a same plane or in an approximately in a same plane. In some cases, a plated layer may not be provided on such end surfaces.

Semiconductor Device

The semiconductor device according to the present embodiment includes, the lead frame describe above, a semiconductor element mounted on the lead frame, and a resin member fixing the lead frame.

(Semiconductor Element)

The semiconductor element is not specifically limited and any semiconductor element constituted with an element semiconductor such as silicon, germanium, or a compound semiconductor such as a Group III-V compound may be employed. Particularly, the semiconductor element is preferably a light emitting element. The light emitting element is generally constituted with a semiconductor layer which includes a light emitting layer and which is stacked on a substrate. The light emitting element may also be constituted with a semiconductor layer obtained by, on a substrate, stacking a semiconductor layer which includes a light emitting layer and then, removing the substrate.

(Substrate)

The substrate is not specifically limited and far example, a substrate generally used for growing a nitride semiconductor layer can be employed. Among those, a light transmissive substrate is preferable. In the specification, the term "light transmissive" means properties of transmitting about 60% or greater, 65% or greater, 70% or greater or 80% or greater emission of the light emitted from the light emitting element. Examples of the substrate include sapphire, spinel, NGO, $LiAlO_2$, $LiGaO_3$, GaN, etc. Among those, a substrate made of an oxide is preferable, a substrate made of a wurtzite-type crystal is more preferable, and a sapphire substrate is further preferable.

(Semiconductor Layer)

The semiconductor layer stacked on the substrate (for example, on the first main surface) preferably includes at least a light emitting structure. More specifically, the semiconductor layer may include, for example, on the substrate, a first semiconductor layer (n-type or p-type semiconductor layer), a light emitting layer, and a second semiconductor layer (p-type or n-type semiconductor layer) which are stacked in this order.

The semiconductor layer includes a structure in which a part of the second semiconductor layer is removed in the thickness direction, in other words, partially removed, and on which the first semiconductor layer is exposed, and on the region of the first semiconductor layer other than the exposed region, the light emitting layer and the second semiconductor layer are stacked. The first semiconductor layer, the light emitting layer, and the second semiconductor layer which are among the components of the semiconductor layer are not specifically limited, and for example, nitride-based compound semiconductors such as $In_XAl_YGa_{1-X-Y}N$ ($0 \leq X$, $0 \leq Y$, $X+Y \leq 1$) can be preferably used. Those nitride semiconductor layers may respectively have a single layer structure, a stacked layer structure made of layers having different compositions and/or thicknesses, or a superlattice structure etc. Particularly, the light emitting layer preferably has a single quantum well structure or a multi-quantum well structure in which thin layers are stacked to produce quantum effect.

(Electrode)

A pair of electrodes of a semiconductor element is arranged on a same surface side of the semiconductor layer. The pair of the electrodes may have either a single layer structure or a stacked layer structure which can be ohmically connected to the first semiconductor layer and the second semiconductor layer described above respectively, which provides a linear or semi-linear current-voltage characteristics. Such electrodes can be formed using any suitable material and structure known in the art, with an appropriate thickness respectively. For example, ten and several microns to three hundred microns is preferred.

Particularly, as described below, in the case where the pair of electrodes of the semiconductor element is electrically connected to the lead portions via a bonding member respectively, a reflective layer (plated layer, DBR layer, etc.) is preferably disposed as the layer closest to the semiconductor layer on each of the pair of the electrode.

The reflective layer is preferably made of a material which has relatively large wavelength dependency in visible light range, and particularly, made of a material whose reflectivity abruptly increases in near violet range to a long wave range. More specifically, the reflective layer is preferably made of a material which can efficiently reflect light of wavelength region (to red region) 350 nm or greater, more preferably 380 nm or greater, further preferably 400 nm or greater. More specifically, Ag or an alloy of Ag may be employed. Examples of Ag alloys include an alloy of Ag with one or at least two metal elements selected from the group consisting of Pt, Co, Au, Pd, Ti, Mn, V, Cr, Zr, Rh, Cu, Al, Mg, Bi, Sn, Ir, Ga, Nd, and Re (rare earth elements). The thickness of the reflective layer may be suitably, in view of efficiently reflecting the incident light, about several tens of nm to about several tens of nm to about several μm. Examples of the DBR layer include $Nb_2O_5$, $TiO_2$, $ZrO_2$, $Ta_2O_3$, $HfO_2$, $SiO_2$, $Al_2O_3$, and $MgF_2$. With the use of the materials described above, particularly in the light emitting element, light emitted from the semiconductor layer is reflected and is efficiently extracted. Also, a semiconductor device having good heat dissipation properties can be obtained. As a result, generation of heat at the time of applying a large current can be reduced and thus the light emitting element of higher output can be realized.

The pair of electrodes of the semiconductor element is generally electrically connected respectively to the lead portions of the lead frame to be described below, through a bonding member. That is, connected in a face-down manner. That is, the element mounting regions, that is, the grooves are formed in conformity to the shape of the electrode of the semiconductor element. In the specification, the term "shape of electrode" of a semiconductor element refers to a surface shape of the electrode (pad electrode) which is in contact with the element mounting region. The electrode (ohmic electrode) which is formed under the pad electrode and is in contact to the semiconductor layer may have a shape different from the shape of the pad electrode and/or the shape of the element mounting region. In the case where employing a structure in which the p-electrode and the n-electrode are partly stacked, for example, stacking an n-electrode via an insulating layer above the p-electrode, the shapes of the p-electrode and the n-electrode which are exposed on the outermost surface preferably in conformity to the element mounting region of the lead frame.

Also, for the light emitting element, a white light emitting element in which a fluorescent material layer is previously formed, a white light emitting element in which a reflective layer made of a resin and/or a metal is formed on the side surfaces and/or a fluorescent material layer is formed on the upper surface of a light emitting element, or the like, may be employed. Further, a light emitting element in which electrodes to connect to a mounting surface are made thick and a stress relaxation layer such as a resin (a white resin) is disposed around it, can also be employed.

(Bonding Member)

The bonding member can be formed using a material which is generally used at the time of bonding a semiconductor element, and for example, a eutectic alloy or a solder may be used. Examples of preferable eutectic alloy include a eutectic alloy film such as an alloy whose main components are Au and Sn, an alloy whose main components are Au and Si, and an alloy whose main components are Au and Ge. Further, an alloy whose main components are Cu and Sn and Ag, an alloy whose main components are Sn and Cu, or an alloy whose main components are Sn and Bi can be cited as a solder. Among those, an AuSn eutectic alloy is preferable. The use of an Au—Sn eutectic alloy can reduce the degradation of the electrodes of the semiconductor element caused by the thermocompression bonding, and also allows for firm bonding to the lead frame.

(Resin Member)

The resin member serves to fix the leaf frames. In the case where a light emitting element is used as the semiconductor element, the resin member preferably includes a reflective surface which can reflect light from the light emitting element. A resin such as a thermosetting resin or a thermoplastic resin can be employed as the resin member. Specific Examples of such a resin include an epoxy resin composition; a silicone resin composition; a modified epoxy resin composition such as a silicone modified epoxy resin; a modified silicone resin composition such as an epoxy modified silicone resin; a polyimide resin composition, a modified polyimide resin composition, polyphthalamide (PPA), a polycarbonate resin; a polyphenylene sulfide (PPS); a liquid crystal polymer (LCP); an ABS resin (acrylonitrile-butadiene-styrene resin); a phenolic resin; an acrylic resin; and a PBT resin (polybutylene terephthalate resin). Particularly, a thermosetting resin is preferable. Among those, a resin preferably has the reflectivity with respect to the light from the light emitting element 60% or more, more preferably 70% or more, 80% or more or 90% or more.

For example, a light reflective material such as titanium oxide, silicon dioxide, zirconium dioxide, potassium titanate, alumina, aluminum nitride, boron nitride, and/or mullite. With this arrangement, light can be reflected efficiently. The light reflective material can be adjusted appropriately according to the conditions of molding such as a method of resin molding or the resin fluidity, or to the properties such as a reflectance and/or mechanical strength. For example, in the case where titanium oxide is employed, an amount of 20 to 40 weight %, further 25 to 35 weight % of titanium oxide is preferably contained with respect to the total weight of the resin material.

The resin member is arranged between the pair of lead frames (that is, lead portions) described above to insulatingly separate the pair of lead frames. The resin member arranged between the lead portions which are spaced apart from each other and opposite to each other preferably cover all the end surfaces in the thickness direction of the lead frames. As described above, in the case where the lead frame has a shape in which a part of the end surface of the lead frame is protruded, for example, in the case where the lead frame is made of a clad material and has a shape in which the end surface of the first metal layer or the second metal layer is protruded more than the end surface of the other metal layer, all the end surfaces in the thickness direction are covered and embedded in the resin member. Thus, the contact area between the lead frames and the resin member is increased and which improves the adhesion between the lead frames and the resin member. Also, with such a partial protrusion of the end surface of the lead frame, an anchor effect can be efficiently obtained. Particularly, as described above, in the case where the first metal layer, a second metal layer, and the third metal layer are bonded in this order to form a three layer structure, and in which all the end surfaces of the first metal layer or the second metal layer in the thickness direction protrude more than the end surfaces of the other metal layer, reliable anchor effect in both an upward direction and downward direction can be obtained. In the case where all the end surfaces in the thickness direction of the second metal layer are protruded more than all the end surfaces of the first metal layer or than the most-protruding end surface of the first metal layer, an anchor effect can also be exerted more efficiently to the resin portion, due to a difference in the linear expansion coefficient of the first metal layer and the second metal layer.

The semiconductor device according to the embodiments, particularly, in the case where a light emitting element is used for the semiconductor element, a light transmissive member which covers a part of the light emitting element and the lead frame may be arranged separately to the resin member described above. The light transmissive member is, in view of light luminous intensity distribution and directivity of the light emitted from the light emitting element, a concave lens shape or a convex lens shape may be employed. Such a light transmissive member can be formed for example by using a silicone resin composition, a modified silicone resin composition, an epoxy resin composition, a modified epoxy resin composition, an acrylic resin composition, a silicone resin, an epoxy resin, a urea resin, a fluororesin, or a hybrid resin containing one or more of those resins.

The light transmissive member may contain a wavelength converting member such as a fluorescent material capable of absorbing light from the light emitting element and emitting light of different wavelength. For example, an oxide-based fluorescent material, a sulfide-based fluorescent material, and/or a nitride-based fluorescent material etc., can be employed. For example, in the case where a gallium nitride based light emitting element to emit blue light is used as the light emitting element, fluorescent materials to absorb blue light, such as a YAG-based fluorescent material or a LAG-based fluorescent material to emit yellow to green light, a SiAlON-based fluorescent material (β-sialon-based fluorescent material) to emit green light, and a SCASN-based fluorescent material and a CASN-based fluorescent material, a KSF-based fluorescent material (K2SiF6:Mn), a sulfide-based fluorescent material to emit red light, can be used singly or in combination. The light transmissive member may contain a light diffusing agent (barium sulfate, titanium oxide, aluminum oxide, silicon oxide, etc.).

In the semiconductor device, a protective element such as a Zener Diode, a Bridge Diode etc., may be arranged on the lead frame.

Embodiment 1

Figure 1B:
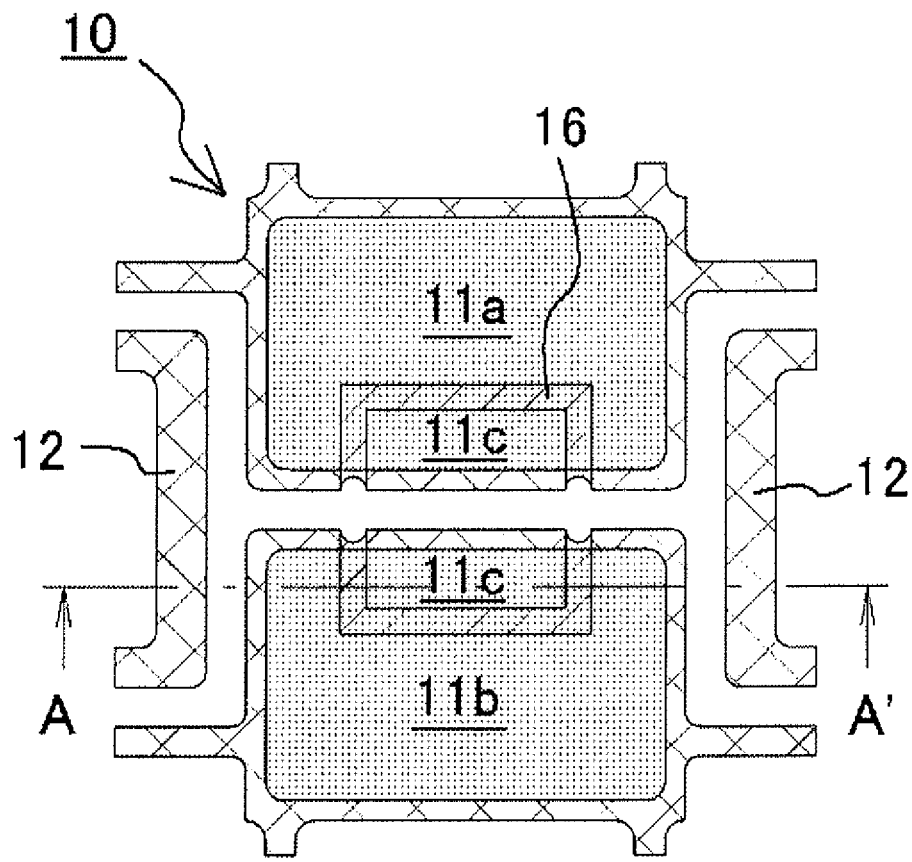
FIG. 1B is a plan view for illustrating showing one unit of the lead frame shown in FIG. 1A.
Figure 1C:
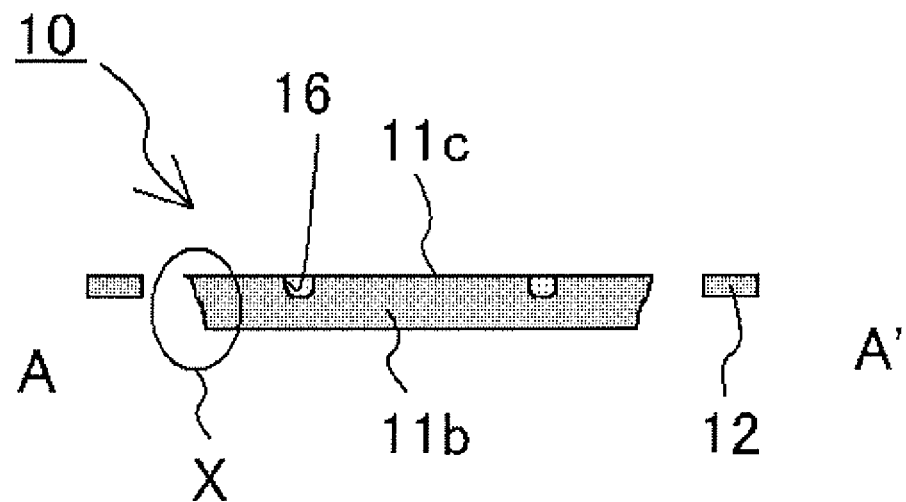
FIG. 1C is a cross sectional view taken along line A-A' of FIG. 1B.

In the lead frame 10 according to the present embodiment, as shown in FIG. 1A and FIG. 1B, in a planer view of one unit U, a pair of positive and negative lead portions 11a, 11b are arranged, and at the both sides of the two lead portions 11a, 11b, the support bars 12 are arranged at the both sides and in parallel of the two lead portions 11a, 11b, in a bridging manner from the lead portion 11a to the lead portion 11b. In other words, the support bars are provided so that a side surface of the support bars 12 are arranged opposite to the corresponding sides of the lead portion 11a and the sides of the lead portions 11b respectively, with the length corresponding to each other. The support bars 12 are, as shown in FIG. 1C, processed to reduce the thickness to be smaller than the thicknesses of the lead portions 11a, 11b, so that on the back-surface, the support bars are recessed from the back-surfaces of the lead portions 11a, 11b. The support bars 12 may be processed so that the back-surface is recessed, as shown in FIG. 1C, or that the surface is recessed. In the case where the support bars are made of a clad material with three-layer structure, the upper layer (the first metal layer) and the lower layer (the first metal layer) may be processed to as to leave only the middle layer (the second metal layer) to expose the middle layer. Also, it is not limited to a clad material, grooving may be applied on the surfaces or the back-surfaces. Further, in FIG. 1C, the entire support bars can be formed to have a thickness smaller than the thickness of the lead portions, and in addition to that, the regions for the processing as described above (providing a recessed portion in an upper surface or a lower surface to partially reduce the thickness) to be a part of the support bars, thus, the thickness can also be appropriately selected.

The lead portions 11a, 11b which are the portions divided in two, respectively include a light emitting element mounting region 11c demarcated by the groove 16 formed in the surface of the lead frame 10. With such an arrangement member of the groove 16, excessive flow of the bonding member can be prevented at the time of bonding a light emitting element by using a bonding member such as a solder, which allows bonding of the light emitting element at an appropriate locations by using self alignment effect. Particularly, a member having poor wettability to a metal bonding member (a solder etc.) can be filled in the groove 16. With the arrangements of the members described above, more efficient self-alignment effect can be obtained.

Figure 1D:
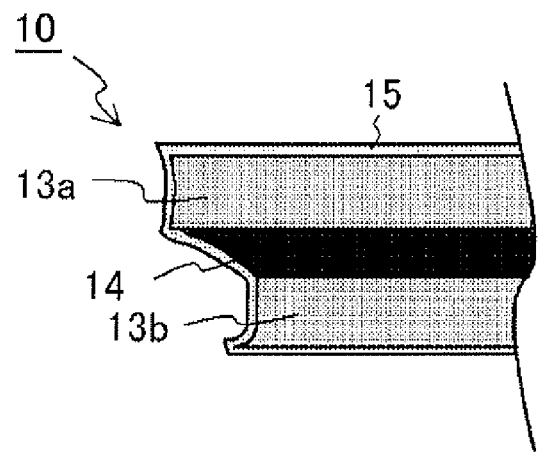
FIG. 1D is an enlarged view of a major portion X shown in FIG. 1C.

The lead frame 10 is made of a clad material, which is as shown in FIG. 1D, from the top (from the side where a light emitting element to be disposed), a first metal layer (about 100 μm in thickness) made of a copper alloy (194), a second metal layer 14 (about 50 μm in thickness) made of an iron alloy (an Fe—Ni alloy, Ni content (36%) about 50 in thickness) are stacked to form a stack layer structure of a first metal layer 13/a second metal layer 14/a first metal layer 13b. The upper and lower surfaces of the clad material, that is, the outer surfaces of the first metal layer 13a, 13b and the end surface of the clad material are covered with a plated layer 15 made of Ag (about 2 to 3 μm in thickness).

In the lead frame 10, the end surface of the first metal layer 13a is more protruded than the end surface of the second metal layer 14. Accordingly, the anchor effect can be efficiently obtained. The end surface of the second metal layer 14 is slanted from the end of the second metal layer 14 side of the first metal layer 13a to meet the end of the second metal layer 14 side of the first metal layer 13b. Further, the end surface of the first metal layer 13b is located at inner side than any portions of the end surface of the first metal layer 13a. Further, the end of the first metal layer 13b adjacent to the second metal layer 14 is located at outer side than the end of the first metal layer 13b which is located opposite side from the second metal layer 14.

Such a shape of the lead frame allows for an improvement in adhesion with the resin member. Also, difference in the linear expansion coefficients between the resin member and the lead frame, and between the semiconductor element and the frame can be reduced. As a result, reliability in those bonding can be enhanced.

Figure 1E:
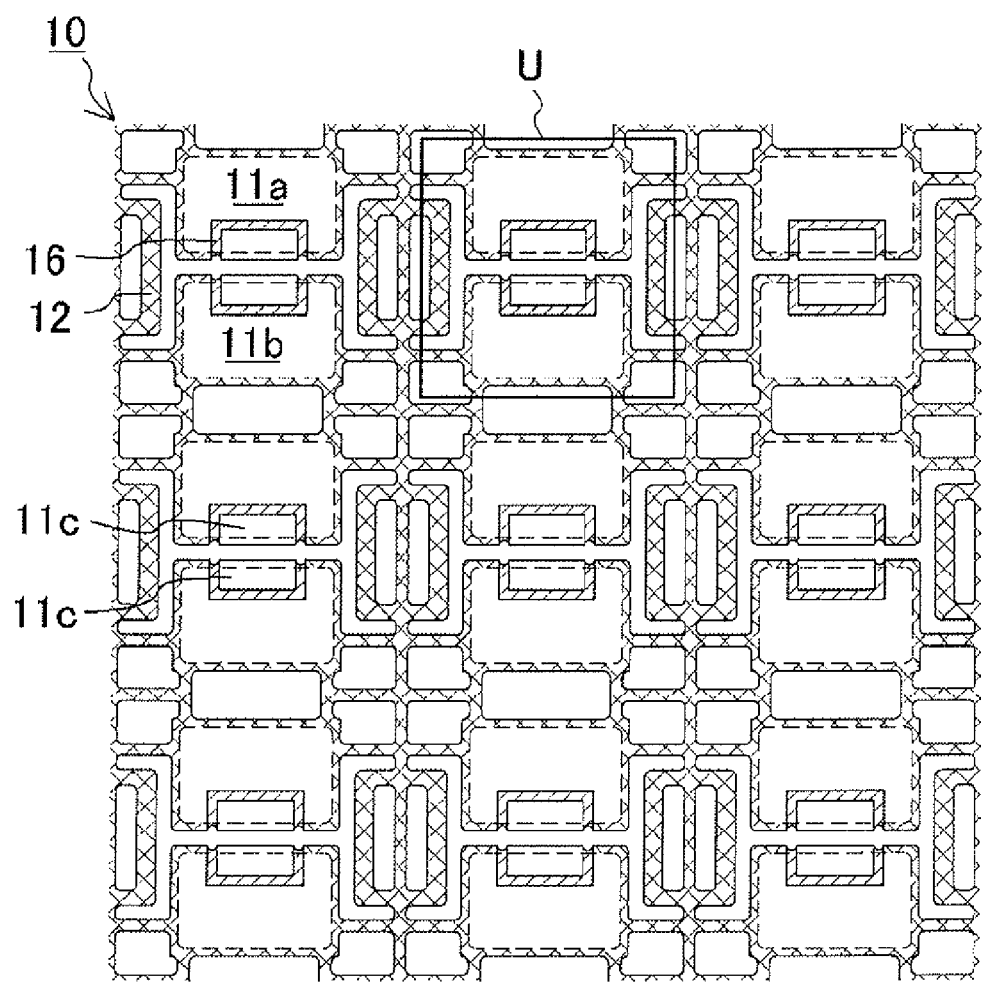
FIG. 1E is a plan view showing a lead frame in which a plurality of lead frame units according to Embodiment 1 of the present invention are connected.

On the lead frame 10 includes, as shown in FIG. 1E, a single unit U which constitutes one light emitting device are arranged in plural in the longitudinal direction and the direction perpendicular to the longitudinal direction.

Such a lead frame can be manufactured according to the method below. First, a clad material having a stacked-layer structure of a first metal layer 13a/a second metal layer 14/a first metal layer 13b is prepared. In the clad material, the joining interface between the first metal layer and the second metal layer is diffusion-joined so as not to allow detachment between the metal layers. On the surface of the clad material, far example, a resist is disposed on the entire surface, and conducting a photolithography process, in detail, through carrying out exposure with the use of an exposure mask having a desired pattern, and then developing, a resist mask having a desired shape is disposed. The mask is used as the etching mask for the lead frame. The pattern shape in this case corresponds to the shapes shown in FIG. 1A. Also, an opening with a slightly wider aperture size than the opening of the mask formed on the surface may be formed. It is preferable that the center lines of the openings of the masks of the surface and the back-surface are arranged to overlap in projection view. After forming a mask on the surface and the back-surface of the clad material, for example, at 45° C., a ferric chloride solution (FeCl$_3$ concentration: 3.2 mol/L, chloride concentration: 0.7 to 2.0 wt %, specific gravity 1.4 g/cc) is sprayed for about 6 minutes to etch the clad material to form the pattern. At this time, a mask with narrow openings for the grooves may be disposed on the surface side, so that the grooves can be formed simultaneously.

In the case where in the lead frame having a shape shown in FIG. 1A, a groove 16 to be formed in the surface of the lead frame, a mask having openings corresponding to the grooves 16 is formed on the surface of the lead frame, and also a mask which covers the entire back-surface is formed. Then, for example, at 45° C., a ferric chloride solution (FeCl$_3$ concentration: 3.2 mol/L, chloride concentration: 0.7 to 2.0 wt %, specific gravity 1.4 g/cc) is sprayed for about 4 minutes to etch the clad material. Alternately, a mask having openings corresponding to the grooves 16 is formed on the upper surface, and on the back-surface, instead of forming the full-surface mask, a mask having openings corresponding to the outer periphery of the lead portions 11a, 11b including the element mounting portion 11c and the groove 16, a portion connected to the outer periphery, and openings corresponding to the support bar 12 is formed, to etch the clad material.

With this, the grooves 16 are etched from the surface side partially into the thickness direction for example, the first metal layer 1a in a part or all of its thickness direction). Further, the outer periphery of the lead portions 11a, 11b including the element mounting region 11c and the groove 16, the portions connected to the outer periphery, and the support bar 12 (portion shown by cross-hatching in FIG. 1A and FIG. 1B) are etched from the back-surface side partially into the thickness direction. Accordingly, in those portions, thicknesses can be reduced while retaining the planar shapes respectively. Accordingly, the problems as shown below can be solved. For example, as a method for partially changing the thickness of the lead frame in its thickness direction, press-working etc., has been used. However, when press working is applied, metals corresponding to the reduced thickness are pushed in the in-plane direction, resulting in a change of the planar shape. In recent years, corresponding to miniaturizing the semiconductor devices, the distance between the electrodes and the terminals and their margins are also miniaturized, and under such circumstances, a change in the planar shape may lead to short circuit between the electrodes and the terminals. On the other hand, as described above, reducing the thickness while retaining the planar shape, occurrence of such a short circuit can be effectively prevented.

The lead frame 24 may be cut by using press-working etc., to obtain a desired shape. At this time, arranging the cross-section to be a single material of the first metal member 26 or the second metal member 28 can eliminate a necessity of cutting a stack of different kinds of metal, which facilitates cutting of the lead frame 24 in the press-working or etching, and thus preferable.

On the other hand, when such a change in the thickness as described above is applied in the lead frame of a semiconductor device, a part of the lead (lead portions 11a, 11b, the element mounting portion 11c) can be exposed from both the upper surface and the lower surface of the resin member to utilize, and the heat dissipating properties of the semiconductor element, particularly the light emitting element can be improved. Further, those exposed portions can be used as the terminals. On the surface side of the lead frame, a member having poor wettability to a metal bonding member (a solder etc.) can be filled in the groove 16. With this arrangement, the bonding member can be disposed on an appropriate location and easily demarcated in an appropriate size. Accordingly, self-alignment effect cab be appropriately produced at the time of bonding the semiconductor element, facilitating arrangement of the semiconductor element to its appropriate location. Further, the resin member can be applied on the outer peripheries of the lead portions 11a, 11b including the element mounting portion 11c and the groove 16, the portions connected to the outer periphery, and the back-surface side of the support bar 12, so that short circuit of the lead frame can be prevented effectively.

Then, using a plating solution containing silver ions, a plated layer is formed on the surface of the lead frame. The conditions of plating can be appropriately adjusted according to the material etc. Before forming the plated layer, as a pretreatment, a degreasing treatment is preferably applied to remove organic substances from the surface of the lead frame. Next to degreasing treatment, surface activation of the lead frame with the use of oxidation or the like is preferably performed. Also, a layer which can improve the adhesion between the silver plated layer and the lead frame may be disposed. For example, a thin layer of about 0.2 μM thickness, such as a strike plated layer, may be disposed as an under layer. Further, a plated layer having a silver plated layer as its outermost surface can be made with various stacked-layer structures. For example, forming a stacked-layer of Ni/Pd/Au/Ag in this order from the lead frame side, a plated layer having high thermal resistance can be obtained. In the case where the lead frame contains iron, for example, a clad material such as Cu/Fe/Cu, the end surface of Fe exposed by the working may be covered with a plated layer, so that the end surface of Fe can be prevented from corrosion.

At the time of plating as described above, in order to improve adhesion of the support bars to the resin member, strike plating may be used to avoid applying plating on the support bars. Accordingly, a lead frame having an end surface described above can be obtained.

Variation Example of Embodiment 1

Figure 1F:
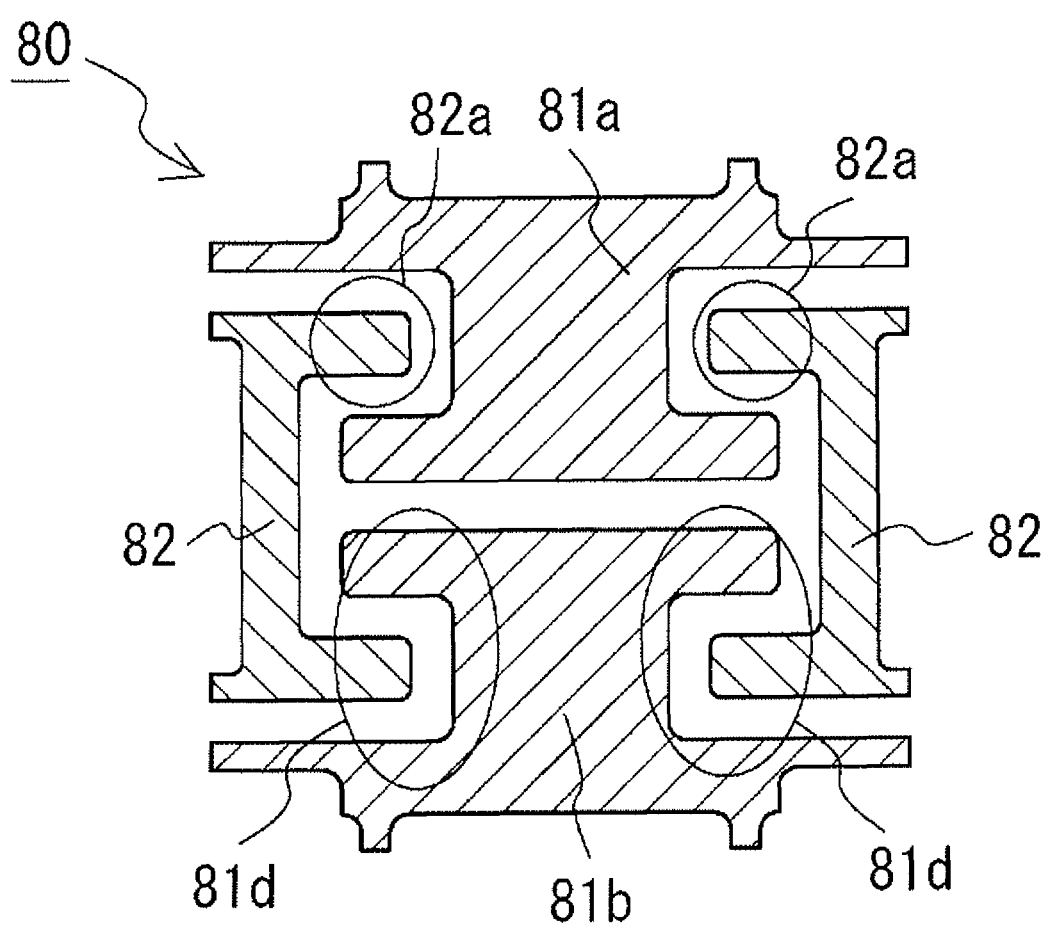
FIG. 1F is an enlarged cross-sectional view showing a major part of a lead frame according to a variation example of Embodiment 1 of the present invention.

The lead frame 80 according to the present embodiment has a substantially similar structure as in Embodiment 1, except that, as shown in FIG. 1F, in a planer view of one unit U, a pair of positive and negative lead portions 81*a*, 81*b* are arranged, and at the both sides of the two lead portions 81*a*, 81*b*, the support bars 82 are arranged at the both sides and in parallel of the two lead portions 81*a*, 81*b*, in a bridging manner from the lead portion 81*a* to the lead portion 81*b*. That is, the recessed portions, i.e., hook-shaped portion, 81*d* extending from the lead frame 80, the lead portions 81*a*, 81*b*, and having a planar shape in a U-shape are provided at the both sides of the lead portions 81*a*, 81*b*, with a total number of four. Also, the tip of the support bar 81 has hook-shaped portions 82*a* which are respectively extending to the lead portions 81*a*, 81*b* side, on their both ends. Thus, the 4 hook-shaped portions 81*d* of the lead portions 81*a*, 81*b* are arranged to surround the hook-shaped portions 82*a* of the support bars 82 respectively. That is, in the arrangement direction of the lead portions (in the longitudinal direction in FIG. 1F), the lead portions 81*a* and the support bars 82 are arranged spaced apart from each other but to overlap with each other, in engaging manner along the recessed or protruded portions with each other. According to the arrangement described above, linear expansion of the both can be cancelled out with each other.

Embodiment 2

Figure 2A:
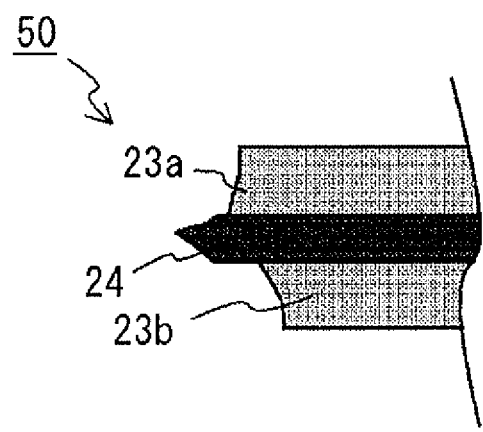
FIG. 2A is a schematic plan view of a lead frame according to Embodiment 2 of the present invention.

The lead frame 50 according to the present embodiment has a similar structure as the lead frame according to Embodiment 1, except that, particularly shown in FIG. 2A, the lead frame 50 is made of a clad material in which a first metal layer 23*a* of a layer (about 100 μm thickness) made of a copper alloy (194), and a second metal layer 24 of a layer (about 100 μm thickness) made of an iron alloy (Fe—Ni alloy, Ni: 36 wt %) are stacked to form a stacked-layer structure of first metal layer 23*a*/second metal layer 24/first metal layer 23*b*, and in the shape of the end surfaces, the second metal layer 24 is protruded more than the first metal layers 23*a*, 23*b*. Such a lead frame 50 can be manufactured according to the method below. The lead frame 50 can be manufactured in a similar manner as in Embodiment 1, except that, in Embodiment 2, for example, the etching solution of the lead frame used in Embodiment 1 is changed to a copper chloride solution, and the size of the opening of the mask made of a resist and etching conditions are adjusted. For example, after forming a resist mask on the upper surface and the lower surface of the lead frame (clad material), at 45° C., a copper chloride solution (CuCl$_3$ concentration: 2.2 mol/L, chloride concentration: 3.0 mol/L, specific gravity 1.28 g/cc) is sprayed for about 6 minutes to etch the clad material to form the pattern. The etching rate of the copper chloride solution to an iron-based alloy is smaller than that of the ferric chloride solution, so that the Fe-based alloy at a middle portion of the layer can be left easily. With the use of the lead frame as described above, similar effects as in Embodiment 1 can be exerted. Moreover, the end surface is markedly protruded at a middle part of the lead frame in the thickness direction, so that a greater anchor effect can be obtained with a simple technique.

Variation Example of Embodiment 2

Figure 2B:
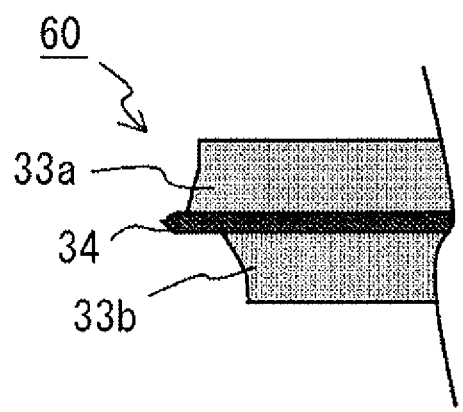
FIG. 2B is a schematic plan view of a lead frame according to Variation Example of Embodiment 2 of the present invention.

The lead frame 60 according to the present embodiment has a similar structure as the lead frame according to Embodiment 1 and Embodiment 2, except that, particularly shown in FIG. 2B, the lead frame 60 is made of a clad material in which a first metal layer 33*a* of a layer (about 150 μm thickness) made of a copper, and a second metal layer 34 of a layer (about 50 μm thickness) made of an iron alloy (Fe—Ni alloy, Ni: 36 wt %) are stacked to form a stacked-layer structure of first metal layer 33*a*/second metal layer 34/first metal layer 33*b*, and in the shape of the end surfaces, the second metal layer 34 is protruded more than the first metal layers 33*a*, 33*b*. Such a lead frame 60 can be manufactured in a similar manner as in Embodiment 2, except for reducing the thickness of the second metal layer. With the use of the lead flame as described above, similar effects as in Embodiment 2 can be exerted. Particularly, a very simple technique of adjusting the thickness of the second metal layer enables adjustment of the degree of protrusion, which allows reliable prevention of short-circuit between the lead framed.

Embodiment 3

Figure 3:
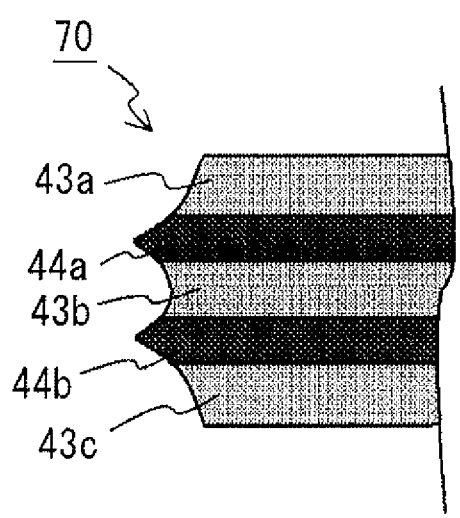
FIG. 3 is a schematic plan view of a lead frame according to Embodiment 3 of the present invention.

The lead frame 70 according to the present embodiment has a similar structure as the lead flame according to Embodiment 1, except that, the lead frame 70 is made of a clad material, particularly shown in FIG. 3, the first metal layer 43*a* of a layer made of copper (about 100 μm thickness) and the second metal layer 44 of a layer made of an iron alloy (Fe—Ni—Co alloy, Ni: 31%, Co: 5%) (about 100 μm thickness) are stacked to form a stacked-layer structure of the first metal layer 43*a*/the second metal layer 44*a*/the first metal layer 43*b*/the second metal layer 44*b*/the first metal layer 43*b*, and in the shape of the end surfaces, the second metal layers 24*a*, 24*b* are more protruded than the first metal layers 43*a*, 43*b*, 43*c*. Such a lead frame 70 can be manufactured in a similar manner as in Embodiment 2. With the use of the lead frame as described above, similar effects as in Embodiment 1 and Embodiment 2 can be exerted. Moreover, the end surface is protruded in two steps at a middle part of the lead frame in the thickness direction, so that a greater anchor effect can be obtained with a simple technique.

Embodiment 4

Figure 4A:
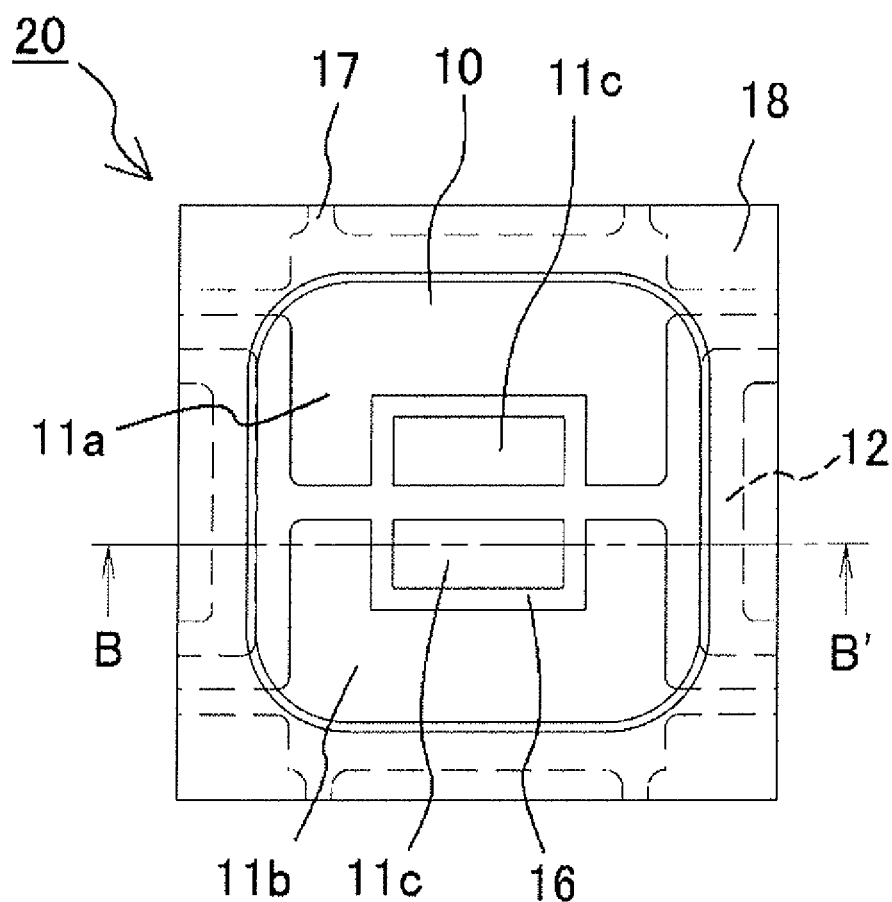
FIG. 4A is a schematic plan view of a semiconductor device according to Embodiment 4 of the present invention.
Figure 4B:
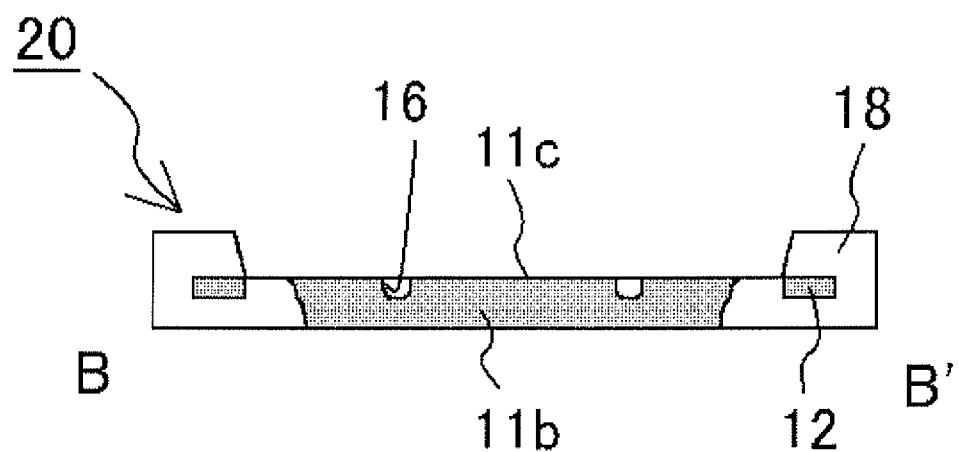
FIG. 4B is a cross sectional view taken along line B-B' of FIG. 4A.
Figure 4C:
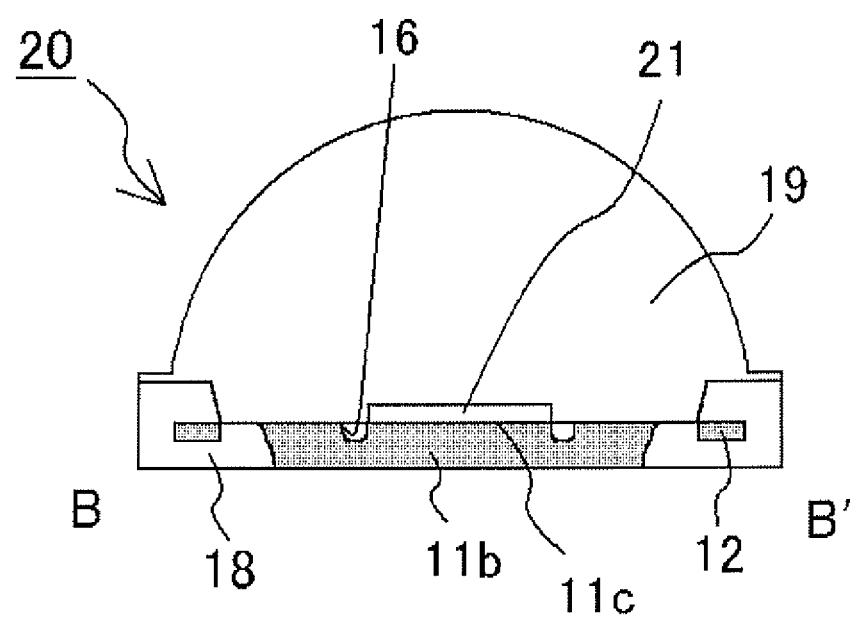
FIG. 4C is a schematic cross-sectional view of a semiconductor device which corresponds to FIG. 4A, taken along line B-B' of FIG. 4A.

The semiconductor device (light emitting device) 20 according to Embodiment 4 includes, particularly, as shown in FIG. 4A and FIG. 4B, the lead frame 10 as in Embodiment 1, the resin member 18 which embeds and fix a part of the lead frame 10, and the light emitting element (21 in FIG. 4C)

mounted on the lead frame 10. In FIGS. 4A, 4B, in order to clarify the positional relationship between the lead frame, the terminal portions 17 of the lead frame, and the resin member, illustration of other members is omitted.

Between the lead portions 11a, 11b which are spaced apart from each other and opposite to each other, the resin member 18 covers all the end surfaces in the thickness direction of the lead frame 10. The light emitting element 21 includes a pair of positive and negative electrodes on a same surface side. The light emitting element 21 is disposed in a face-down manner bridging between the two lead portions 11a, 11b of the element mounting portion 11c of the lead frame 10. That is, with the use of a eutectic solder (Au—Sn) as the bonding member, each of the electrodes of the light emitting element 21 are connected to the lead portions 11a, 11b of the lead frame 10 which are extending to the positive and negative terminals, respectively. The electrodes of the light emitting element have a shapes in conformity to the element mounting regions of the lead frame, and in the embodiment, the electrodes of the positive side and the negative side are formed in rectangular shapes with approximately same shape and size. As described above, forming the positive electrode and the negative electrode with an approximately same size allows for more uniform distribution of stress at the time of bonding, so that high bonding strength can be obtained. Also, as shown in FIG. 4C, over the resin member 18, the light transmissive member 19 covering a part of the lead frame 10 and the light emitting element 21 is arranged in a convex lens shape.

Although not shown, a protective element is mounted on a lead frame 10 which does not have a light emitting element 21 mounted thereon, and the protective element is electrically connected to the lead frame 10 via electrically conductive wires.

In Embodiment 4, a reduction in the linear expansion coefficient of the lead frame itself is achieved due to the use of a Fe-alloy, which has a linear expansion coefficient smaller than that of Cu which is generally used for a lead frame, as the second metal layer 14. With this arrangement, the linear expansion coefficient of the lead frame can be approximated to the linear expansion coefficient of the light emitting element itself. As a result, joint breakage between the light emitting element (for example, electrode) and the lead frame can be prevented. This effect is remarkable, particularly, in the case where the light emitting element is bonded on the lead frame in a face-down manner. Accordingly, in the case where any member is used as the bonding member to bond the light emitting element and the lead frame, with the reduction in the linear expansion coefficient of the lead frame, even there is a difference in the linear expansion coefficients between the bonding member and the light emitting element, the difference becomes possible to be canceled out. Thus, joint breakage between the light emitting element and the lead frame can be further prevented.

Further, while realizing a reduction in the linear expansion coefficient of the lead frame, a material having a linear expansion coefficient larger than that of the light emitting element and has good heat dissipating property can also be used. Accordingly, the heat dissipating property of the light emitting element can be maintained or improved. This also allows employing of a material which has good adhesion with the resin member and/or the bonding member while achieving a reduction in the linear expansion coefficient of the lead frame. Accordingly, the light emitting device of higher reliability can be obtained.

Particularly, the lead frame used in Embodiment 4 includes support bars which are spaced apart from the lead portions respectively, and are partially enclosed with a resin member. Thus, the strength of the package itself can be improved. With this arrangement, at the time of mounting the light emitting element which is disposed bridging the two lead portions, bonding strength can be secured and the reliability can be improved. Also, in the present embodiment, the support bars are etched only on the back surface sides to reduce the thickness respectively. But etching may be applied from both the surface and the back-surface sides to only leave a material having a small linear expansion coefficient. Also, forming the surface in an irregular shape such as a shape with recesses and protrusions or a corrugated shape, or forming only the support bars un-plated, adhesion to the resin member can be further improved.

Embodiment 5

Figure 5:
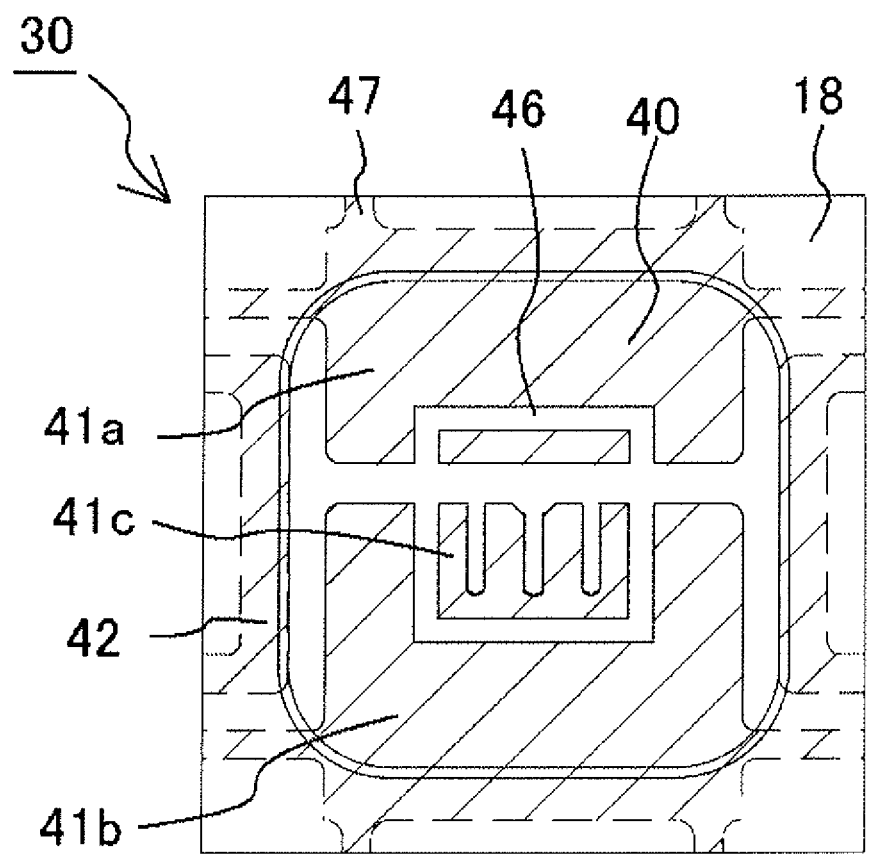
FIG. 5 is a plan view of a semiconductor device according to Embodiment 5 of the present invention.

The light emitting device according to the present embodiment has a substantially similar structure as in the light emitting device according to Embodiment 4, except that, as shown in FIG. 5, the shape of the element mounting region 41c of the lead frame 40 is demarcated to be smaller at the lead portion 41a side by the groove 46, and recesses and protrusions are arranged in a comb-like shape is arranged on the surface of the lead portion 41b. In FIG. 5, in order to clarify the positional relationship between the lead frame 40, the terminal portion 47 and the resin member 18, illustration of other members is omitted.

The recess in the comb-like shape on the surface of the lead portion 41b can be formed such that, in the method of manufacturing lead frame in Embodiment 1, together with the opening for the groove, a pattern of an opening in a recess pattern of a comb-like shape, is also formed in the mask for forming the groove, and etching is carried out simultaneously to the etching of groove 46. With such a comb-like recess, the shape of the element mounting portion 41c of the lead portion 41a can be formed in conformity to the shape of the electrode of the light emitting element. Accordingly, the self-aligning effect of the light emitting element can be further produced. As a result, the light emitting element can be bonded easily to an appropriate location.

Embodiment 6

Figure 6A:
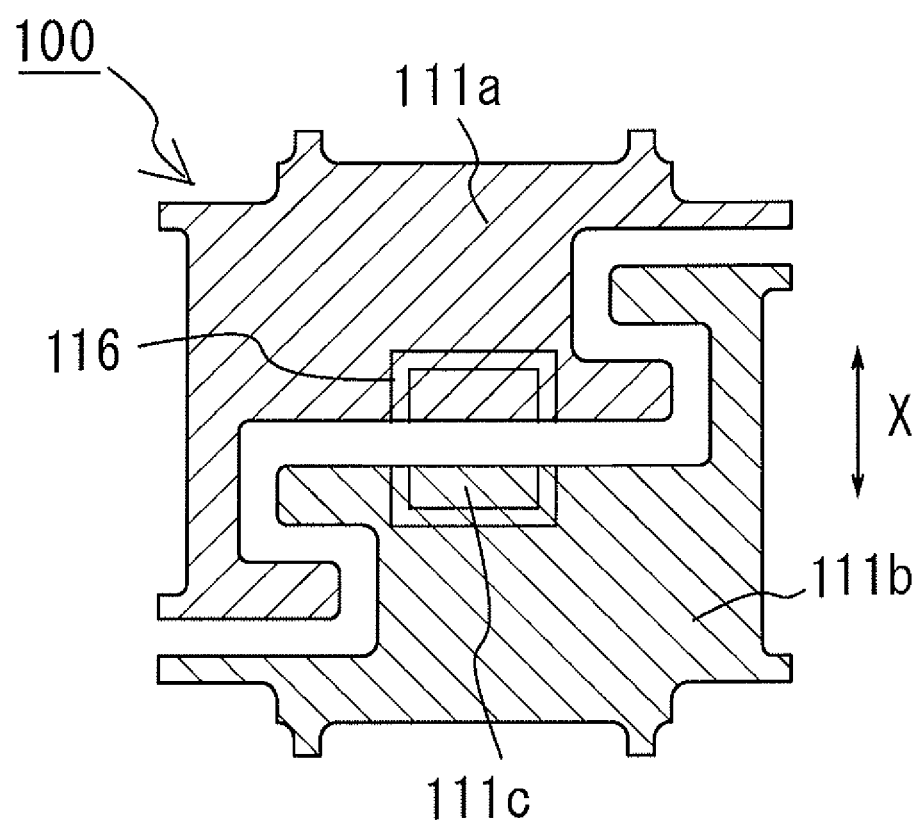
FIG. 6A is a plan view showing one unit of a lead frame according to Embodiment 6 of the present invention.
Figure 6B:
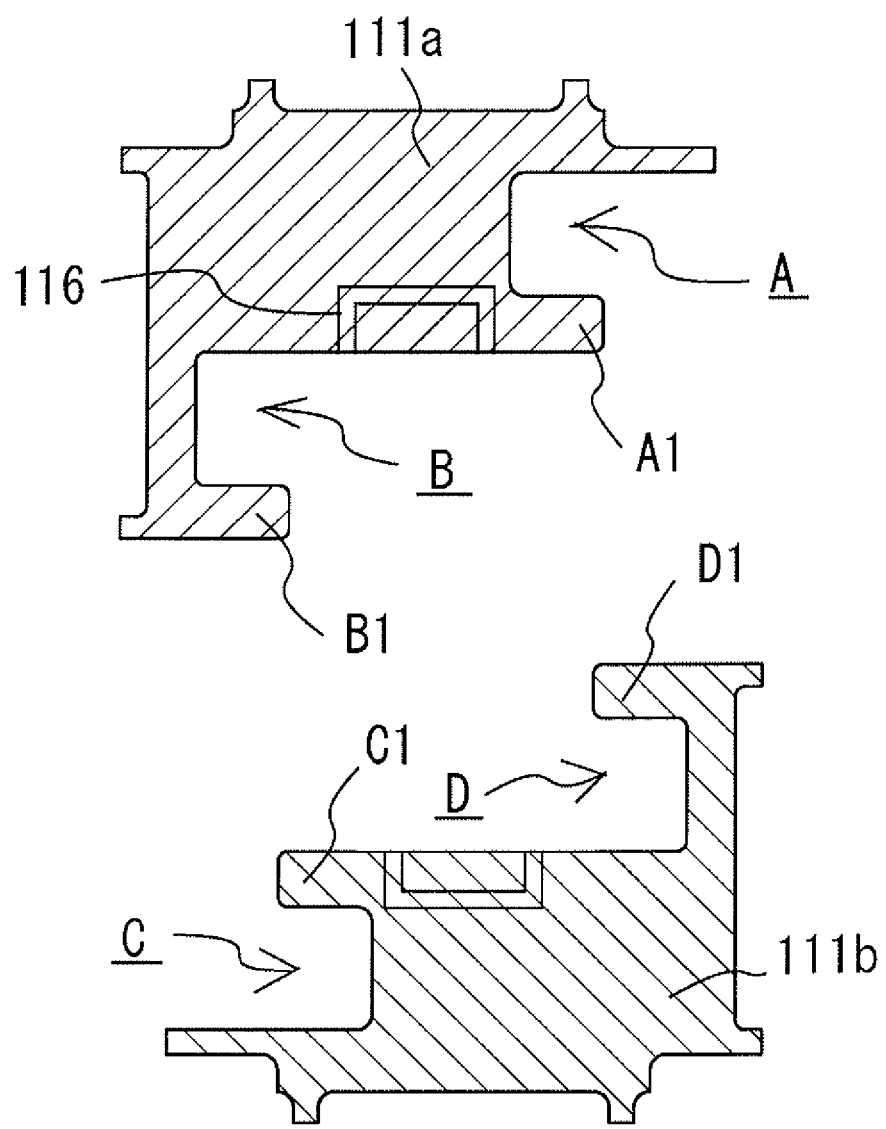
FIG. 6B is an exploded plan view illustrating each portion of the lead frame shown in FIG. 6.

The lead frame 110 according to the present embodiment has, as shown in FIG. 6A and FIG. 6B, in a planer view of one unit U, a pair of positive and negative lead portions 111a, 111b, and two hook-shaped portions A, B, C, and D having a planar shape of a U-shape or an L-shape, respectively extending from the two lead portions 111a, 111b. That is, the lead portion 111a has two hook-shaped portions A, B extending from the lead portion 11a at left and right both sides in arrangement direction (X direction in FIG. 6A) of a pair of lead portions 11a, 111b. The lead portion 11b has two hook-shaped portions C, D extending from the lead portion 111ba at the both sides in the X direction. The hook-shaped portion A of the lead portion 111a is arranged to surround the tip portion D1 of the hook-shaped portion D of the lead portion 111b. The hook-shaped portion D of the lead portion 111b is arranged to surround the tip portion A1 of the hook-shaped portion A of the lead portion 111a. The hook-shaped portion C of the lead portion 111b is arranged to surround the tip portion B1 of the hook-shaped portion B of the lead portion 111a. The hook-shaped portion B of the lead portion 111a is arranged to surround the tip portion C1 of the hook-shaped portion C of the lead portion 111b. Those hook-shaped portions A, B, C, and D may have a same thickness as that of the lead portions 111a, 111b, but on the back-surfaces thereof are processed to be thinner than the lead portions 111a, 111b so as to be recessed from the back-surface of the lead portions 111a, 111b.

The lead portions 111a, 111b which are the portions divided in two, respectively include a light emitting element mounting region 11c demarcated by the groove 16 formed in the surface of the lead frame 100. With such an arrangement of the groove 16, excessive flow of the bonding member can be prevented at the time of bonding a light emitting element by using a bonding member such as a solder, which allows bonding of the light emitting element at an appropriate locations by using self alignment effect. Particularly, a resin member to be described below is preferably embedded in the groove 116. With the arrangements of the members described above, more efficient self-alignment effect can be obtained.

Figure 6C:
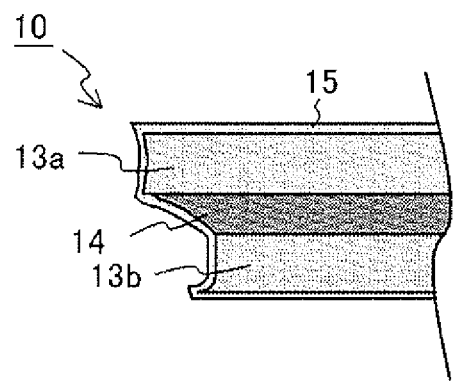
FIG. 6C is a schematic cross-sectional view of a major part of the lead frame shown in FIG. 6A.

The lead frame 100 is made of a clad material, which is as shown in FIG. 6C, a first metal layer (about 100 μm in thickness) made of a copper alloy (194), a second metal layer 14 (about 50 μm in thickness) made of an iron alloy (an Fe—Ni alloy, Ni content (36%) about 50 in thickness) are stacked to form a stack layer structure of a first metal layer 13/a second metal layer 14/a first metal layer 13b. The surface and the back-surface of the clad material, that is, the outer surfaces of the first metal layer 13a, 13b and the end surface of the clad material are covered with a plated layer 15 made of Ag (about 3.0 μm in thickness).

In the lead frame 100, the end surface of the first metal layer 13a is more protruded than the end surface of the second metal layer 14. Accordingly, the anchor effect can be efficiently obtained. The end surface of the second metal layer 14 is slanted from the end of the second metal layer 14 side of the first metal layer 13a to meet the end of the second metal layer 14 side of the first metal layer 13b. Further, the end surface of the first metal layer 13b is located at inner side than any portions of the end surface of the first metal layer 13a. Further, the end of the first metal layer 13b adjacent to the second metal layer 14 is located at outer side than the end of the first metal layer 13b which is located opposite side from the second metal layer 14.

With such a shape, the mechanical strength of the semiconductor devices manufactured using the lead frame can be improved, and the semiconductor devices with high reliability in element bonding can be manufactured. More specifically, when the semiconductor device mounted with a semiconductor element in use, destruction of element caused by change in stress generated by repetitive expansions and contractions of the element which are caused by repetitive ON-OFF operations and/or repetitive cold and warm cycling in environment can be reduced. More specifically, in the case where the semiconductor element is mounted on the lead frame in a face-down manner, such effects can be greatly exerted, and stress experienced on the semiconductor element and the lead frame can be reduced.

Figure 6D:
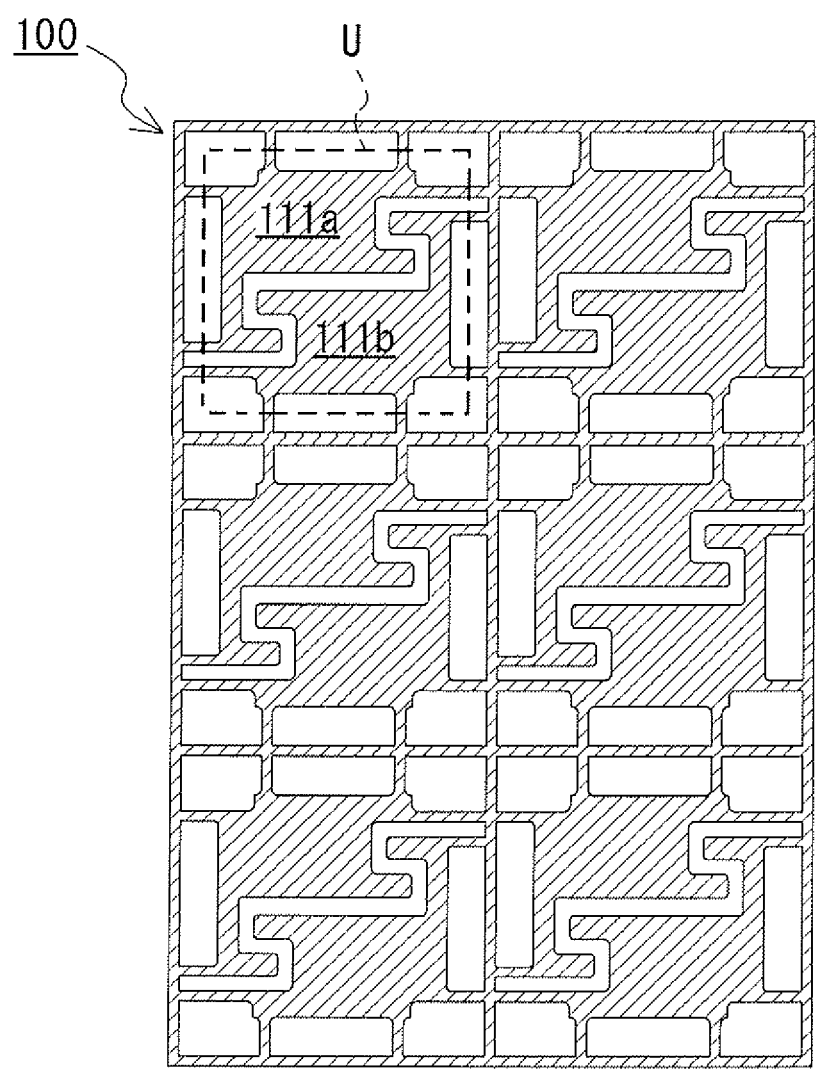
FIG. 6D is a plan view showing a lead frame in which a plurality of lead frame units of FIG. 6A is connected.

On the lead frame 100 includes, as shown in FIG. 6D, a single unit U which constitutes one light emitting device are arranged in plural in the longitudinal direction and the direction perpendicular to the longitudinal direction.

Such a lead frame can be manufactured according to the method of manufacturing described in Embodiment 1.

Alternately, a mask of Embodiment 1, having openings corresponding to the grooves 116 is formed on the upper surface, and on the back-surface, instead of forming the full-surface mask, a mask having openings corresponding to the outer periphery of the lead portions 111a, 111b including the element mounting portion 111c and the groove 116, a portion connected to the outer periphery, and when needed, openings corresponding to the support bar 12 is formed, to etch the clad material.

With this, the grooves 116 are etched from the surface side partially in the thickness direction (for example, the first metal layer in a part or all of its thickness direction). Further, the outer periphery of the lead portions 111a, 111b which include the element mounting portion 111c and the groove 116, the portions corresponding to the hook-shaped portions A, B, C, and D, and the portions connected to the outer periphery and the hook-shaped portions are partially (for example, a part or all of the first metal layer 1a in the thickness direction) etched from the back-surface side. Accordingly, in those portions, thicknesses can be reduced while retaining the planar shapes respectively.

Further, on the back-surface sides of the lead portions 111a, 111b which include the element mounting portion 111c and the groove 116, the portions corresponding to the hook-shaped portions A, B, C, and D, and the portions connected to the outer periphery and the hook-shaped portions can be covered with a resin member, so that occurrence of short circuit due to exposure of those portions can be prevented effectively. With the use of the lead frame as described above, in addition to the effects described above, similar effects as in Embodiment 1 can be exerted.

Variation Example of Embodiment 6

The lead frame according to the present embodiment has a similar structure as the lead frame 50 according to Embodiment 6, except for as shown in FIG. 2A, having a cross-sectional shape which is similar to that in Embodiment 2. With the use of the lead frame as described above, in addition to the effects described above, similar effects as in Embodiments 1 and 6 can be exerted.

Variation Example 2 of Embodiment 6

The lead frame according to the present embodiment has a similar structure to the lead frame according to Embodiment 6, except for particularly, as shown in FIG. 2B, having a cross-sectional shape which is similar to that in Variation Example of Embodiment 2. With the use of the lead frame as described above, similar effects as in Embodiments 2 and 6 can be exerted.

Variation Example 3 of Embodiment 6

The lead frame according to the present embodiment has a similar structure as the lead frame according to Embodiment 6, except for as shown in FIG. 3, having a cross-sectional shape which is similar to that in Embodiment 3. With the use of the lead frame as described above, similar effects as in Embodiments 3 and 6 can be exerted.

Embodiment 7

Figure 7:
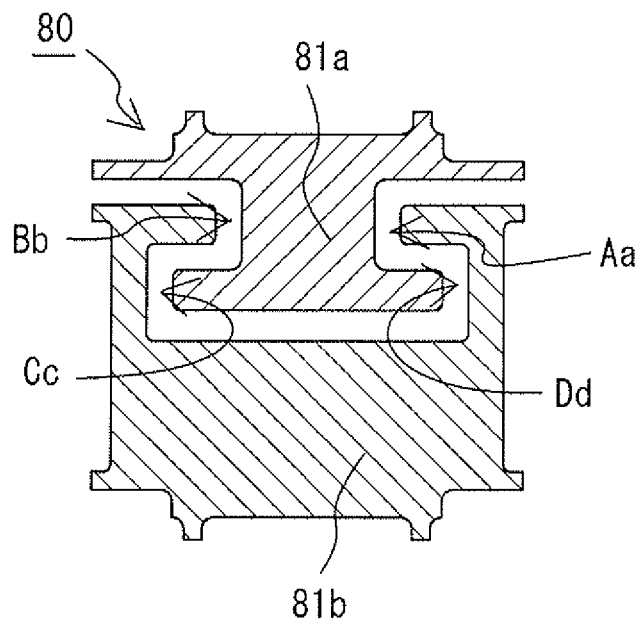
FIG. 7 is a plan view showing one unit of a lead frame according to Embodiment 7 of the present invention.

The lead frame 80 according to the present embodiment has a substantially similar structure as in Embodiment 1, except that, as shown in FIG. 7, in a planer shape of one unit U, a pair of positive and negative lead portions 81a, 81b are arranged, and hook-shaped portions Aa, Bb, Cc, and Dd each having a planar shape of a U-shape or a U shape with right angles are respectively extended from the two lead portions 81a, 81b. That is, the lead portion 81a has two hook-shaped portions Aa, Bb extending from the lead portion 81*a* at left and right both sides in line symmetry in the arrangement direction of a pair of lead portions 81*a*, 81*b*. The lead portion 81*b* has two hook-shaped portions C, D extending from the lead portion 81*b* at left and right both sides in line symmetry in the arrangement direction of a pair of lead portions 81*a*, 81*b*.

Embodiment 8

Figure 8:
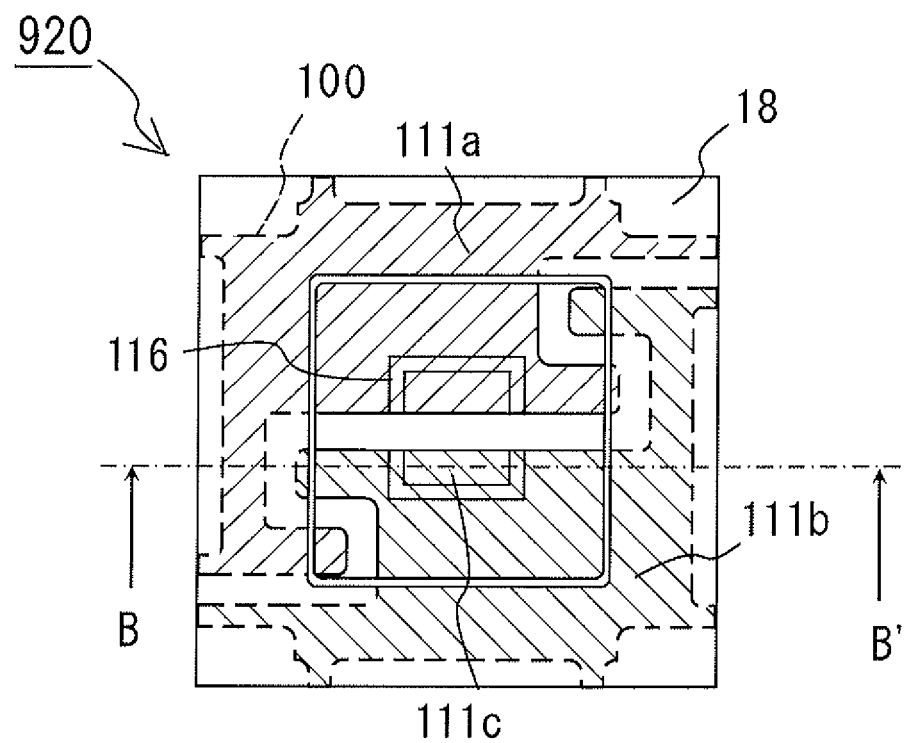
FIG. 8 is a plan view of a major part of a semiconductor device according to Embodiment 8 of the present invention.

The light emitting device 920 according to the present embodiment includes, particularly, as shown in FIG. 8, the lead frame 100 as in Embodiment 6, the resin member 18 which embeds and fixes a part of the lead frame 100, and the light emitting element (21 in FIG. 4C) mounted on the lead frame 100. The light emitting device shown in FIG. 8 has a substantially similar cross-section taken along line B-B' to that shown in FIG. 4B and FIG. 4C. In FIG. 8, in order to clarify the positional relationship between the lead frame, the terminal portion, and the resin member, illustration of other members is omitted.

Between the lead portions 111*a*, 111*b* which are spaced apart from each other and opposite to each other, the resin member 18 covers all the end surfaces in the thickness direction of the lead frame 100. The light emitting element 21 includes a pair of positive and negative electrodes on the same surface side. The light emitting element 21 is disposed in a face-down manner bridging between the two lead portions 11*a*, 11*b* of the element mounting portion 11*c* of the lead frame 10. That is, with the use of a eutectic solder (Au—Sn) as the bonding member, each of the electrodes of the light emitting element 21 are connected to the lead portions 11*a*, 11*b* of the lead frame 10 which are extending to the positive and negative terminals, respectively. Also, as shown in FIG. 4C, over the resin member 18, the light transmissive member 19 covering a part of the lead frame 10 and the light emitting element 21 is arranged in a convex lens shape (see FIG. 4C).

The lead frame used in Embodiment 8 employs a Fe-alloy which has a linear expansion coefficient smaller than that of Cu which is generally used for a lead frame, as the second metal layer. Also, a pair of lead portions respectively has hook-shaped portions at portions corresponding to the both sides of the light emitting element. The hook-shaped portions are arranged opposite to and engaged with each other. With this arrangement, the linear expansion coefficient of the lead frame itself can be reduced, to close to the linear expansion coefficient of the light emitting element itself. Further, expansion of the lead portions can be cancelled out. As a result, it becomes possible to prevent joint breakage between the light emitting element (for example, electrode) and the lead frame. This effect is remarkable, particularly, in the case where the light emitting element is bonded on the lead frame in a face-down manner. Particularly, at both the mounting side (surface side) of the light emitting element and the back-surface side, a part of the hook-shaped portions are respectively embedded in the resin portion. Thus, occurrence of short circuit due to exposure of the hook-shaped portions can be prevented effectively.

The light emitting device as described above can provide, in addition to the effects described above, similar effects as in Embodiments 4 and 6.

Embodiment 9

Figure 9A:
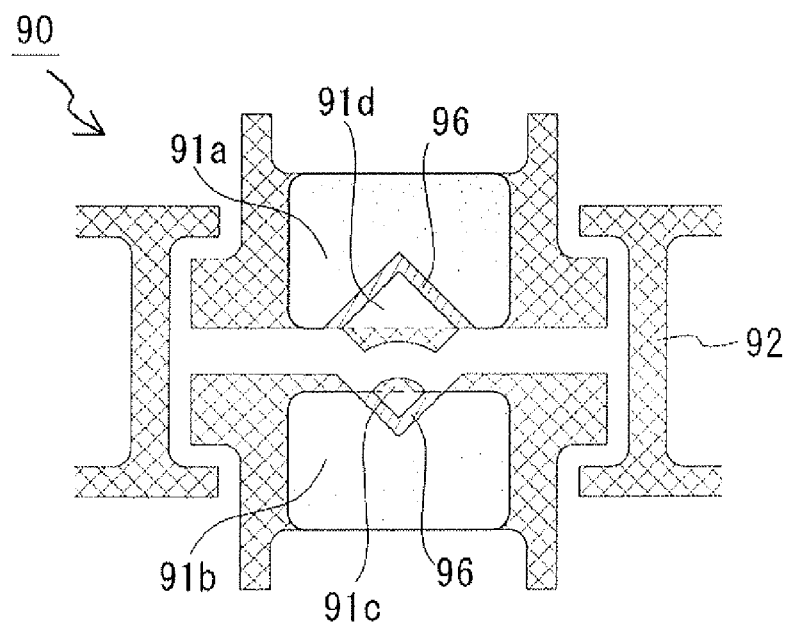
FIG. 9A is a plan view of a lead frame according to Embodiment 9 of the present invention.

In the lead frame 90 according to the present embodiment, a plurality of single units U are arranged in a matrix, and in the single unit U, as shown in FIG. 9A, the shapes of the element mounting regions 91*c*, 91*d* of the lead portions 91*a*, 91*b* are respectively demarcated by the grooves 96 defined in the surface. The element mounting regions 91*c*, 91*d* respectively have a shape so that the diagonal lines of the light emitting element to be mounted thereon are substantially in parallel to the longitudinal direction and the direction perpendicular to the longitudinal direction in the matrix. In other words, the two opposite corners are at the end portion of the lead portion 91*a*. Accordingly, the grooves 96 are defined in an L-shape in the lead portions 91*a*, 91*b*, respectively.

Figure 9B:
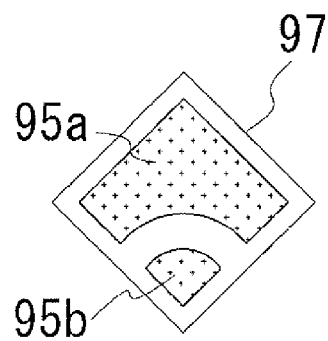
FIG. 9B is a plan view of a light emitting element showing an electrode pattern of a light emitting element to be mounted on the lead frame shown in FIG. 9A.

FIG. 9B is a top view of the light emitting element 97, in which a pair of positive and negative electrodes 95 are provided. As shown in the figure, the light emitting element 97 has the n-electrode 95*b* having a ¼ circular shape centered at one of the corners of a quadrangular shape and the p-electrode 95*a* arranged spaced apart from the n-electrode 95*b*. The element mounting regions 91*d*, 91*c* of the lead frame 90 each has a shape corresponds to the pattern of the p-electrode 95*a* or the n-electrode 95*b* of the light emitting element shown in FIG. 9B. That is, the element mounting region 91*c* of the lead portion 91*b* which corresponds to the n-electrode of the light emitting element has, in a top view, a circular arc projection at an end portion. The groove 96 is defined in an L-shape to surround the L-shape projection. The electrode mounting region 91*c* has a thickness greater at the inner side of the lead portion 91*b*, that is a side close to the groove, and smaller at the projected portion as the portion defining the groove 96.

The electrode mounting region 91*d* corresponding to the p-electrode of the light emitting element has, in a top view, a shape having a projection, an end portion thereof is recessed along the ¼ circular arc. The electrode mounting region 91*d* has a thickness greater at the inner side of the lead portion 91*a*, that is a side close to the groove, and smaller at the projected portion as the portion defining the groove 96. With such element mounting regions 91*c*, 91*d*, a half of the planar dimension (area) of the light emitting element, that is, with respect to a virtual diagonal line interconnecting two opposite corners, one half of the area is mounted on the region of the lead frame 90 having a greater thickness, and the other half area is mounted on the region having mostly a smaller thickness. The region with a smaller thickness in the element mounting regions 91*c*, 91*d* can be formed, for example, by etching the lead frame 90 from its back-surface side. In this case, the lead frame 9 may have a stacked layer structure, but for example, may also have a single layer made of copper. The regions with smaller thicknesses may be expanded toward the groove 96 side compared to the projecting portion, as long as the element mounting regions 91*c*, 91*d* are not cut.

In the lead frame 90, support bars 92 are arranged at the both sides of the two lead portions 91*a*, 91*b*, so as to bridge from the lead portion 91*a* to the lead portion 91*b*.

Figure 9C:
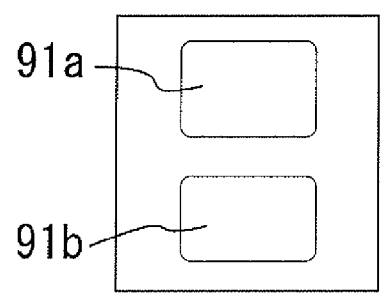
FIG. 9C is a diagram showing an exposed status of the lead frame on a back-surface in the case where the lead frame shown in FIG. 9A is used in a light emitting device.

The lead frame 90 includes in addition to the element mounting regions 91*c*, 91*d*, a portion partially etched from the back-surface side in the thickness direction in the outer periphery (shown by cross-hatching in the figure). With this arrangement, in the case where a resin member is applied on the lead frame 90 to fabricate the light emitting device, as shown in FIG. 9C, the lead portions 91*a*, 91*b* of the lead frame 90 are respectively exposed in an approximately quadrangular shape at the back-surface side of the light emitting device. With the use of the lead frame as described above, similar effects as in Embodiment 1 can be exerted.

INDUSTRIAL APPLICABILITY

The light emitting device according to the present invention can be applied to various kinds of light emitting devices such as illumination light sources, light sources for various kinds of indicators, light sources for automobile use, light sources for displays, back light sources for liquid crystal displays, light sources for sensors, signals, and so on. Also, the light emitting device is applicable to all the light emitting devices, such as so-called side-view type light emitting devices, which use a lead frame.

What is claimed is:

1. A semiconductor device comprising:
   a semiconductor element having a pair of electrodes on a same surface side;
   a lead frame including:
      a pair of lead portions arranged spaced apart from and opposite to each other in a first direction, the lead portions electrically connected to the pair of electrodes of the semiconductor element; and
      a pair of support bars arranged spaced apart from the lead portions, and extending from a side of one lead portion toward a side of the other lead portion,
      an overall length of each of the support bars along the first direction being shorter than a length from a distal end of the one lead portion to a distal end of the other lead portion along the first direction, or shorter than a length of the semiconductor device along the first direction; and
   a resin member including a concave portion in which the semiconductor element is arranged, the lead portions at least partially defining a bottom surface of the concave portion,
   the support bars of the lead frame being embedded in the resin member adjacent to the concave portion, and
   the semiconductor element being mounted on both of the lead portions with the semiconductor element bridging between the lead portions.

2. The semiconductor device according to claim 1, wherein
   the lead frame further includes:
      an anchor-shaped portion extending from each of the lead portions, the anchor-shaped portion having a U-shape in a plan view; and
      a hook-shaped portion extending from a tip of each of the support bars towards the lead portion;
   wherein the anchor-shaped portion is formed to surround the hook-shaped portions of the support bars.

3. The semiconductor device according to claim 1, wherein:
   the lead frame comprises a clad material in which at least a first metal layer and a second metal layer are stacked;
   the first metal layer comprising a first metal; and
   the second metal layer comprising a second metal, the second metal being different from the first metal.

4. The semiconductor device according to claim 3, wherein:
   the first metal layer has a linear expansion coefficient larger than the linear expansion coefficient of the second metal layer.

5. The semiconductor device according to claim 3, wherein:
   the first metal layer has a higher solubility in an etching solution than the second metal layer.

6. The semiconductor device according to claim 5, wherein:
   the etching solution is a solution of ferric chloride or copper chloride.

7. The semiconductor device according to claim 3, wherein:
   at least one of a front surface, a back-surface, or an end surface of the clad material is covered with a plated layer.

8. The semiconductor device according to claim 3, wherein:
   the first metal layer includes copper or a copper alloy, and the second metal layer includes iron or an iron alloy.

9. The semiconductor device according to claim 3, wherein:
   the clad material has a three-layer structure which includes:
      the first metal layer,
      the second metal layer, and
      a third metal layer including a third metal stacked in this order;
   the third metal being substantially the same as the first metal.

10. The semiconductor device according to claim 1, wherein:
   each support bar is thinner than the lead portion in a direction perpendicular to the direction in which the support bar extends.

11. The semiconductor device according to claim 3, wherein:
   the support bars have a two-layer structure, the two-layer structure comprising the first metal layer and the second metal layer.

12. The semiconductor device according to claim 1, wherein:
   the semiconductor element is a light emitting element.

13. The semiconductor device according to claim 1, wherein:
   the semiconductor element is disposed on the lead portions in a face-down manner.

* * * * *